United States Patent
Sakai et al.

(10) Patent No.: US 8,043,438 B2
(45) Date of Patent: Oct. 25, 2011

(54) DEVICE FOR CLEANING CVD DEVICE AND METHOD OF CLEANING CVD DEVICE

(75) Inventors: Katsuo Sakai, Tokyo (JP); Kaoru Abe, Tokyo (JP); Seiji Okura, Tokyo (JP); Masaji Sakamura, Tokyo (JP); Hitoshi Murata, Tokyo (JP); Kenji Kameda, Tokyo (JP); Etsuo Wani, Tokyo (JP); Akira Sekiya, Ibaraki (JP)

(73) Assignees: National Institute of Advanced Industrial Science and Technology, Tokyo (JP); Canon Anelva Corporation, Kawasaki-shi (JP); Ulvac, Inc., Chigasaki-shi (JP); Sanyo Electric Co., Ltd., Moriguchi-shi (JP); Sony Corporation, Tokyo (JP); Tokyo Electron Limited, Tokyo (JP); Hitachi Kokusai Electric Inc., Tokyo (JP); Renesas Electronics Corporation, Kawasaki-shi (JP); Fujitsu Semiconductor Limited, Yokohama-shi (JP)

( * ) Notice: Subject to any disclaimer, the term of this patent is extended or adjusted under 35 U.S.C. 154(b) by 56 days.

(21) Appl. No.: 10/548,874

(22) PCT Filed: Mar. 12, 2004

(86) PCT No.: PCT/JP2004/003269
§ 371 (c)(1),
(2), (4) Date: Apr. 27, 2006

(87) PCT Pub. No.: WO2004/082009
PCT Pub. Date: Sep. 23, 2004

(65) Prior Publication Data
US 2006/0207630 A1    Sep. 21, 2006

(30) Foreign Application Priority Data
Mar. 14, 2003   (JP) .................... 2003-070329

(51) Int. Cl.
*B08B 9/00* (2006.01)
(52) U.S. Cl. ............... 134/22.1; 134/1.1; 156/345.25
(58) Field of Classification Search ................ 134/22.1
See application file for complete search history.

(56) References Cited

U.S. PATENT DOCUMENTS
5,169,407 A * 12/1992 Mase et al. ............... 29/25.01
(Continued)

FOREIGN PATENT DOCUMENTS
EP     1 028 175 A1    8/2000
(Continued)

OTHER PUBLICATIONS

Ion Attachment Mass Spectrometer (IAMS) for in situi and Fragment-Free Monitoring of Plasma CVD and Dry Etching Processes. By Canon Anelva accessed at http://www.canon-anelvatx.co.jp/iams/technology/AVS.pdf.*

(Continued)

*Primary Examiner* — Michael Kornakov
*Assistant Examiner* — Eric Golightly
(74) *Attorney, Agent, or Firm* — Oblon, Spivak, McClelland, Maier & Neustadt, L.L.P.

(57) ABSTRACT

An apparatus for cleaning a CVD apparatus that can efficiently remove a by-product such as $SiO_2$ or $Si_3N_4$ stuck and deposited onto the surface of an internal wall, an electrode, or the like in a reaction chamber in a film forming process, and a method for cleaning a CVD apparatus. A control monitors luminous intensity data of an F radical in a reaction chamber by optical emission spectroscopy and compares the data with calibrated prestored luminous intensity data, and ends cleaning after a predetermined time passes from reaching a luminous intensity saturation point. Furthermore, concentration data of $SiF_4$ in a gas discharged from the reaction chamber are monitored by a Fourier transform infrared spectrometry and compared with prestored concentration data of $SiF_4$ to decide that the predetermined time has passed when a predetermined cleaning end point concentration is reached, thereby ending the cleaning.

1 Claim, 15 Drawing Sheets

U.S. PATENT DOCUMENTS

| | | | |
|---|---|---|---|
| 5,683,538 A * | 11/1997 | O'Neill et al. | 156/345.28 |
| 5,868,852 A * | 2/1999 | Johnson et al. | 134/1.1 |
| 6,815,362 B1 * | 11/2004 | Wong et al. | 438/706 |
| 6,881,276 B2 | 4/2005 | Blonigan et al. | |
| 2001/0048074 A1 * | 12/2001 | Shiokawa et al. | 250/286 |
| 2003/0005943 A1 * | 1/2003 | Singh et al. | 134/1.1 |
| 2003/0183244 A1 * | 10/2003 | Rossman | 134/1.1 |
| 2004/0045577 A1 * | 3/2004 | Ji et al. | 134/1.1 |

FOREIGN PATENT DOCUMENTS

| | | | |
|---|---|---|---|
| EP | 1028175 | * | 8/2000 |
| JP | 06-318579 | | 11/1994 |
| JP | 08-176828 | | 7/1996 |
| JP | 08-296045 | | 11/1996 |
| JP | 9-69504 | | 3/1997 |
| JP | 2000-235955 | | 8/2000 |
| JP | 2001-28362 | | 1/2001 |
| JP | 2001-174437 | | 6/2001 |
| JP | A-2001-527151 | | 12/2001 |
| JP | 2002-517740 | | 6/2002 |
| JP | A-2002-517740 | | 6/2002 |
| JP | 2002-280376 | | 9/2002 |
| WO | WO 99/64814 | | 12/1999 |
| WO | WO 02/090615 A1 | | 11/2002 |

OTHER PUBLICATIONS

Nakamura, In suit anaylsis of perfluoro compounds in semiconductor process exhaust: Use of Li+ IAMS, 2001.*

Nakamura, M., "In situ analysis of perfluoro compounds in semiconductor process exhaust: Use of $Li^+$ ion-attachment mass spectrometry," J. Vac. Technol., vol. 19, No. 4, Jul. 2001, pp. 1105-1110.

* cited by examiner

Relationship between luminous intensity of F-radical obtained by optical emission spectroscopy (OES) and etching rate Amount of discharge of SiF4 (FTIR)

DEVICE FOR CLEANING CVD DEVICE AND METHOD OF CLEANING CVD DEVICE

TECHNICAL FIELD

The present invention relates to a chemical vapor deposition (CVD) apparatus for forming a uniform thin film of high quality, for example, silicon oxide ($SiO_2$) or silicon nitride ($Si_3N_4$ or the like) on the surface of a base material for a semiconductor such as a silicon wafer.

In more detail, the present invention relates to an apparatus for cleaning a CVD apparatus which can execute cleaning and removing a by-product stuck to the internal wall of a reaction chamber or the like after a thin film forming process, and a method for cleaning the CVD apparatus using the same.

BACKGROUND ART

Conventionally, a thin film such as silicon oxide ($SiO_2$) or silicon nitride ($Si_3N_4$ or the like) has been used widely for a semiconductor such as a thin film transistor, a photoelectric converting device or the like. The following three kinds of methods are mainly used as a method of forming the thin film such as the silicon oxide or the silicon nitride.

(1) Physical Vapor Phase Film Forming Method Such as Sputtering or Vacuum Deposition More specifically, in the method, a solid thin film material is set to be an atom or an atomic group by a physical technique and is deposited over a surface on which a film is to be formed, and a thin film is thus formed.

(2) Thermal CVD Method

More specifically, in the method, the thin film material of a gas is set to have a high temperature, to form a thin film by chemical reaction.

(3) Plasma CVD method

More specifically, in the method, the thin film material of a gas is changed into a plasma to form a thin film by chemical reaction.

In particular, the plasma CVD method (plasma enhanced chemical vapour deposition) in (3) has been used widely because a dense and uniform thin film can be efficiently formed (see Japanese Laid-Open Patent Publication No. Hei 9-69504 and Japanese Laid-Open Patent Publication No. 2001-28362).

A plasma CVD apparatus 100 to be used in the plasma CVD method is generally constituted as shown in FIG. 15.

More specifically, the plasma CVD apparatus 100 comprises a reaction chamber 102 maintained under reduced pressure, and an upper electrode 104 and a lower electrode 106 are provided to be opposed to each other at a constant interval in the reaction chamber 102. A film forming gas supply path 108 connected to a film forming gas source which is not shown is connected to the upper electrode 104 in such a manner that a film forming gas is supplied into the reaction chamber 102 through the upper electrode 104.

Moreover, a high frequency applying device 110 for applying a high frequency is connected to the vicinity of the upper electrode 104 in the reaction chamber 102. Furthermore, an exhaust path 114 for discharging an exhaust gas through a pump 112 is connected to the reaction chamber 102.

In the plasma CVD apparatus 100 thus constituted, monosilane ($SiH_4$), $N_2O$, $N_2$, $O_2$, Ar or the like in the formation of the film of the silicon oxide ($SiO_2$) and monosilane ($SiH_4$), $NH_3$, $N_2$, $O_2$, Ar or the like in the formation of the film of the silicon nitride ($Si_3N_4$ or the like) are introduced through the film forming gas supply path 108 and the upper electrode 104 into the reaction chamber 102 maintained in a pressure, for example, 130 Pa.

In this case, for example, a power having a high frequency of 13.56 MHz is applied through the high frequency applying device 110 to a portion between the electrodes 104 and 106 provided opposite to each other in the reaction chamber 102, thereby generating a high frequency electric field. In the electric field, an electron is caused to collide with the neutral molecule of a film forming gas so that a high frequency plasma is formed and the film forming gas is decomposed into an ion and a radical.

By the action of the ion and the radical, a thin silicon film is formed on the surface of a semiconductor product W such as a silicon wafer which is provided on the lower electrode 106 to be one of the electrodes.

In such a plasma CVD apparatus 100, a thin film material such as $SiO_2$ or $Si_3N_4$ is also stuck and deposited onto the surface of an internal wall, an electrode or the like in the reaction chamber 102 not only the semiconductor product W on which a film is to be formed. By a discharge in the reaction chamber 102, a by-product is formed in a film forming process.

The by-product is peeled by a dead weight, a stress or the like when it grows to have a constant thickness, and particulates are mixed as foreign matters into a semiconductor product, thereby causing a contamination in the film forming process. Thus, a thin film of high quality cannot be manufactured so that the disconnection or short circuit of a semiconductor circuit might be caused, and furthermore, a yield or the like might also be deteriorated.

For this reason, conventionally, such by-product is removed after the end of the film forming process in the plasma CVD apparatus 100 by using a cleaning gas, a fluorine containing compound such as $CF_4$, $C_2F_6$ or $COF_2$ and $O_2$ or the like are added if necessary, for example (see the Japanese Laid-Open Patent Publication No. Hei 9-69504 and the Japanese Laid-Open Patent Publication No. 2001-28362).

More specifically, in the conventional cleaning method for the plasma CVD apparatus 100 using such a cleaning gas, a cleaning gas constituted by a fluorine containing compound such as $CF_4$, $C_2F_6$ or $COF_2$ is introduced in place of a film forming gas in the film formation together with a gas such as $O_2$ and/or Ar through the film forming gas supply path 108 and the upper electrode 104 into the reaction chamber 102 maintained under reduced pressure after the film forming process is ended as shown in FIG. 15.

In the same manner as in the film formation, a high frequency power is applied through the high frequency applying device 110 to a portion between the electrodes 104 and 106 provided opposite to each other in the reaction chamber 102, thereby generating a high frequency electric field, and an electron in the electric field is caused to collide with the neutral molecule of the cleaning gas to form a high frequency plasma so that the cleaning gas is decomposed into an ion and a radical.

Then, the ion and the radical react to a by-product such as $SiO_2$ or $Si_3N_4$ which is stuck and deposited onto the surface of the internal wall, the electrode or the like in the reaction chamber 102 so that the by-product is changed into a gas as $SiF_4$. Consequently, the $SiF_4$ is discharged together with an exhaust gas to the outside of the reaction chamber 102 through the exhaust path 114 by means of the pump 112.

In such cleaning, under the existing circumstances, a time required for the cleaning is determined experientially to end the cleaning.

If the time required for the cleaning is too short, accordingly, the by-product such as $SiO_2$ or $Si_3N_4$ stuck and deposited onto the surface of the internal wall, the electrode or the like in the reaction chamber 102 remains. When the CVD apparatus is used repetitively, consequently, particulates are mixed into a semiconductor product, resulting in a contamination as described above. Therefore, a thin film of high quality cannot be manufactured so that the disconnection or short circuit of a semiconductor circuit is caused, and furthermore, a yield or the like is also deteriorated.

To the contrary, if the time required for the cleaning is too long, the cleaning gas introduced into the reaction chamber 102 is exactly discharged without contributing to the cleaning. For this reason, a cleaning gas constituted by a fluorine containing compound such as $CF_4$ or $C_2F_6$ is discharged into the air. Consequently, there is a possibility that an environment might be adversely influenced.

More specifically, the fluorine containing compound such as $CF_4$ or $C_2F_6$ to be used as a cleaning gas has a long lifetime and is stable in the air. Moreover, there is a problem in that a gas discharging process is hard to perform after the cleaning and the cost of the process is high. Furthermore, a global warming potential (an integral period 100-year value) is very great, that is, 6500 with $CF_4$, 9200 with $C_2F_6$ and 23900 with $SF_6$ so that the global warming is greatly influenced.

If the time required for the cleaning is thus prolonged, moreover, a throughput is reduced so that a productivity is deteriorated.

SUMMARY OF THE INVENTION

In consideration of such circumstances, it is an object of the present invention to provide an apparatus for cleaning a CVD apparatus which can efficiently remove a by-product such as $SiO_2$ or $Si_3N_4$ stuck and deposited onto the surface of an internal wall, an electrode or the like in a reaction chamber in a film forming process, and furthermore, can execute cleaning in which the amount of a cleaning gas to be discharged is very small, an influence on an environment such as global warming is small, a gas utilization efficiency is high and a productivity can also be enhanced, and a method for cleaning a CVD apparatus using the same cleaning apparatus.

The present invention has been made in order to solve the problems of the conventional art described above and to attain the object, and provides an apparatus for cleaning a CVD apparatus comprising:

a reactive gas introducing device for applying a high frequency to a reactive gas supplied into a reaction chamber through a reactive gas supply path and changing the reactive gas into a plasma, and supplying the reactive gas thus changed into the plasma into the reaction chamber; and a counter electrode stage provided in the reaction chamber and serving to mount a base material for forming a deposited film, the deposited film being formed on a surface of the base material over the counter electrode stage with the reactive gas changed into the plasma introduced into the reaction chamber through the reactive gas introducing device, wherein an optical emission spectroscopy (OES) for carrying out an optical emission spectral analysis of an F radical in the reactive chamber to measure a luminous intensity, a mass spectroscopy for measuring an F intensity or both of them is/are additionally provided in the reaction chamber, when the deposited film is formed on the surface of the base material by means of the CVD apparatus and a cleaning gas is then introduced to carry out cleaning in the reaction chamber, luminous intensity data of the F radical in the reaction chamber, F intensity data or both of the data are monitored by means of the optical emission spectroscopy, the mass spectroscopy or both of them, and the data are compared with prestored luminous intensity data, F intensity data or both of the data to carry out a control to end the cleaning after a predetermined time passes since a luminous intensity saturation point or an F intensity saturation point is reached.

Moreover, the present invention provides a method for cleaning a CVD apparatus comprising:

a reactive gas introducing device for applying a high frequency to a reactive gas supplied into a reaction chamber through a reactive gas supply path and changing the reactive gas into a plasma, and supplying the reactive gas thus changed into the plasma into the reaction chamber; and a counter electrode stage provided in the reaction chamber and serving to mount a base material for forming a deposited film, the deposited film being formed on a surface of the base material over the counter electrode stage with the reactive gas changed into the plasma introduced into the reaction chamber through the reactive gas introducing device, the method comprising the steps of:

when forming the deposited film on the surface of the base material by means of the CVD apparatus and then introducing a cleaning gas to carry out cleaning in the reaction chamber, carrying out an optical emission spectral analysis of an F radical in the reaction chamber by means of an optical emission spectroscopy (OES) provided additionally in the reaction chamber to measure a luminous intensity, to measure an F intensity in the reaction chamber by means of a mass spectroscopy or to measure both of them, monitoring luminous intensity data of the F radical in the reaction chamber, F intensity data or both of the data by means of the optical emission spectroscopy, the mass spectroscopy or both of them, and comparing the data with prestored luminous intensity data, F intensity data or both of the data to end the cleaning after a predetermined time passes since a luminous intensity saturation point or an F intensity saturation point is reached.

After the predetermined time passes since the luminous intensity saturation point of the F radical in the reaction chamber or the F intensity saturation point is reached by the optical emission spectral analysis to be carried out by means of the optical emission spectroscopy (OES), the measurement of the F intensity to be carried out by means of the mass spectroscopy or both of them, the cleaning is ended.

Accordingly, the amount of the F radical excited to contribute to the cleaning and returned to an original state again in the reaction chamber is set to be constant. Consequently, it is possible to accurately end the cleaning in the reaction chamber at the time that the cleaning is to be completed.

In addition, the cleaning is ended after the predetermined time passes since the luminous intensity saturation point or the F intensity saturation point is reached. Therefore, it is possible to carry out the cleaning over the by-product such as $SiO_2$ or $Si_3N_4$ stuck and deposited onto the piping of a gas discharging path or the like, thereby ending the cleaning accurately at the time that the cleaning is to be completed.

Accordingly, it is possible to prevent the time required for the cleaning from being excessively shortened and to perfectly remove the by-product such as $SiO_2$ or $Si_3N_4$ stuck and deposited onto the surface of the internal wall, the electrode or the like in the reaction chamber, the piping of the gas discharging path or the like without remaining.

Even if the CVD apparatus is used repetitively, consequently, particulates can be prevented from being mixed into a semiconductor product so that a contamination is not caused. Thus, a thin film of high quality can be manufactured, the disconnection or short circuit of a semiconductor circuit can be prevented from being caused and a yield or the like can be prevented from being deteriorated.

Moreover, the time required for the cleaning can be prevented from being excessively prolonged and the cleaning gas introduced into the reaction chamber can be prevented from being exactly discharged without contributing to the cleaning.

Accordingly, the cleaning gas constituted by the fluorine containing compound such as $CF_4$ or $C_2F_6$ can be prevented from being discharged into the air and there is no possibility that an adverse influence on an environment such as global warming might be generated.

Furthermore, the luminous intensity of the F radical obtained by the optical emission spectroscopy (OES) and the F intensity obtained by the mass spectroscopy are proportional to the etching rate (cleaning rate) of the by-product. Therefore, the cleaning is maintained for a predetermined time in a state in which a cleaning efficiency is high. Consequently, the cleaning efficiency can be enhanced.

Moreover, the present invention provides an apparatus for cleaning a CVD apparatus comprising:
  a reactive gas introducing device for applying a high frequency to a reactive gas supplied into a reaction chamber through a reactive gas supply path and changing the reactive gas into a plasma, and supplying the reactive gas thus changed into the plasma into the reaction chamber; and
  a counter electrode stage provided in the reaction chamber and serving to mount a base material for forming a deposited film,
  the deposited film being formed on a surface of the base material over the counter electrode stage with the reactive gas changed into the plasma introduced into the reaction chamber through the reactive gas introducing device,
  wherein a Fourier transform infrared spectrometry (FTIR) for analyzing an exhaust gas component is provided on a gas discharging path for discharging a gas from the reaction chamber, and
  when the deposited film is formed on the surface of the base material by means of the CVD apparatus and a cleaning gas is then introduced to carry out cleaning in the reaction chamber,
  concentration data of $SiF_4$ in the gas discharged from the reaction chamber are monitored by means of the Fourier transform infrared spectrometry and are compared with prestored concentration data of $SiF_4$ to carry out a control to end the cleaning when a predetermined cleaning end point concentration is reached.

Furthermore, the present invention provides a method for cleaning a CVD apparatus comprising:
  a reactive gas introducing device for applying a high frequency to a reactive gas supplied into a reaction chamber through a reactive gas supply path and changing the reactive gas into a plasma, and supplying the reactive gas thus changed into the plasma into the reaction chamber; and
  a counter electrode stage provided in the reaction chamber and serving to mount a base material for forming a deposited film,
  the deposited film being formed on a surface of the base material over the counter electrode stage with the reactive gas changed into the plasma introduced into the reaction chamber through the reactive gas introducing device, the method comprising the steps of:
  when forming the deposited film on the surface of the base material by means of the CVD apparatus and then introducing a cleaning gas to carry out cleaning in the reaction chamber,
  analyzing an exhaust gas component by means of a Fourier transform infrared spectrometry (FTIR) provided on a gas discharging path for discharging a gas from the reaction chamber, and
  monitoring concentration data of $SiF_4$ in the gas discharged from the reaction chamber by means of the Fourier transform infrared spectrometry and comparing the data with prestored concentration data of $SiF_4$ to end the cleaning when a predetermined cleaning end point concentration is reached.

The concentration data of $SiF_4$ in the gas discharged from the reaction chamber are monitored by the Fourier transform infrared spectrometry provided on the gas discharging path and the cleaning is ended when the predetermined cleaning end point concentration is reached.

Accordingly, the concentration of the gasified $SiF_4$ generated by a reaction to the by-product such as $SiO_2$ or $Si_3N_4$ stuck and deposited onto the surface of the internal wall, the electrode or the like in the reaction chamber, the piping of the gas discharging path or the like during the cleaning is monitored directly. Therefore, the cleaning can be ended accurately at the time that the cleaning is to be completed.

Therefore, it is possible to prevent the time required for the cleaning from being excessively shortened and to perfectly remove the by-product such as $SiO_2$ or $Si_3N_4$ stuck and deposited onto the surface of the internal wall, the electrode or the like in the reaction chamber, the piping of the gas discharging path or the like without remaining.

Even if the CVD apparatus is used repetitively, consequently, particulates can be prevented from being mixed into the semiconductor product so that a contamination is not caused. Thus, a thin film of high quality can be manufactured, the disconnection or short circuit of a semiconductor circuit can be prevented from being caused and a yield or the like can be prevented from being deteriorated.

Moreover, the time required for the cleaning can be prevented from being excessively prolonged and the cleaning gas introduced into the reaction chamber can be prevented from being exactly discharged without contributing to the cleaning.

Accordingly, the cleaning gas constituted by a fluorine containing compound such as $CF_4$ or $C_2F_6$ can be prevented from being discharged into the air and there is no possibility that an adverse influence on an environment such as global warming might be generated.

In addition, the present invention provides an apparatus for cleaning a CVD apparatus comprising:
  a reactive gas introducing device for applying a high frequency to a reactive gas supplied into a reaction chamber through a reactive gas supply path and changing the reactive gas into a plasma, and supplying the reactive gas thus changed into the plasma into the reaction chamber; and a counter electrode stage provided in the reaction chamber and serving to mount a base material for forming a deposited film, the deposited film being formed on a surface of the base material over the counter electrode stage with the reactive gas changed into the plasma introduced into the reaction chamber through the reactive gas introducing device, wherein an optical emission spectroscopy (OES) for carrying out an optical emission spectral analysis of an F radical in the reactive chamber to measure a luminous intensity, a mass spectroscopy for measuring an F intensity or both of them is/are additionally provided in the reaction chamber, a Fourier transform infrared spectrometry (FTIR) for analyzing an exhaust gas component is provided on a gas discharging path for discharging a gas from the reaction chamber, and when the deposited film is formed on the surface of the base material by means of the CVD apparatus and a cleaning gas is then introduced to carry out cleaning in the reaction chamber, luminous intensity data of the F radical in the reaction chamber, F intensity data or both of the data are monitored by means of the optical emission spectroscopy, the mass spectroscopy or both of them, the data are compared with prestored luminous intensity data, F intensity data or both of the data to carry out a control to end the cleaning after a predetermined time passes since a luminous intensity saturation point or an F intensity saturation point is reached, and concentration data of $SiF_4$ in the gas discharged from the reaction chamber are monitored by means of the Fourier transform infrared spectrometry and are compared with prestored concentration data of $SiF_4$ to decide that the predetermined time has passed when a predetermined cleaning end point concentration is reached, thereby carrying out a control to end the cleaning.

Moreover, the present invention provides a method for cleaning a CVD apparatus comprising:

a reactive gas introducing device for applying a high frequency to a reactive gas supplied into a reaction chamber through a reactive gas supply path and changing the reactive gas into a plasma, and supplying the reactive gas thus changed into the plasma into the reaction chamber; and a counter electrode stage provided in the reaction chamber and serving to mount a base material for forming a deposited film, the deposited film being formed on a surface of the base material over the counter electrode stage with the reactive gas changed into the plasma introduced into the reaction chamber through the reactive gas introducing device, the method comprising the steps of:

when forming the deposited film on the surface of the base material by means of the CVD apparatus and then introducing a cleaning gas to carry out cleaning in the reaction chamber, carrying out an optical emission spectral analysis of an F radical in the reaction chamber by means of an optical emission spectroscopy (OES) provided additionally in the reaction chamber to measure a luminous intensity, to measure an F intensity in the reaction chamber by means of a mass spectroscopy or to measure both of them, analyzing an exhaust gas component by means of a Fourier transform infrared spectrometry (FTIR) provided on a gas discharging path for discharging a gas from the reaction chamber, monitoring luminous intensity data of the F radical in the reaction chamber, F intensity data or both of the data by means of the optical emission spectroscopy, the mass spectroscopy or both of them, comparing the data with prestored luminous intensity data, F intensity data or both of the data, when a luminous intensity saturation point or an F intensity saturation point is reached, and monitoring concentration data of $SiF_4$ in the gas discharged from the reaction chamber by means of the Fourier transform infrared spectrometry and comparing the data with prestored concentration data of $SiF_4$ to decide that a predetermined time has passed when a predetermined cleaning endpoint concentration is reached, thereby ending the cleaning.

Thus, the luminous intensity data of the F radical in the reaction chamber are monitored by means of the optical emission spectroscopy, the F intensity data in the reaction chamber are monitored by the mass spectroscopy, or both of the data are monitored, and are compared with the prestored luminous intensity data, the F intensity data or both of the data. When the luminous intensity saturation point or the F intensity saturation point is reached, the concentration data of $SiF_4$ in the gas discharged from the reaction chamber are monitored by means of the Fourier transform infrared spectrometry. When the predetermined cleaning end point concentration is reached, consequently, it is decided that the predetermined time has passed and the cleaning is thus ended.

Accordingly, the amount of the F radical excited in the reaction chamber to contribute to the cleaning and returned to an original state again in the reaction chamber is set to be constant. Consequently, it is possible to accurately end the cleaning in the reaction chamber at the time that the cleaning is to be completed.

In addition, the cleaning is ended after the predetermined time passes since the luminous intensity saturation point or the F intensity saturation point is reached. Therefore, it is possible to carry out cleaning over a by-product such as $SiO_2$ or $Si_3N_4$ stuck and deposited onto the piping of a gas discharging path or the like, thereby ending the cleaning accurately at the time that the cleaning is to be completed.

Referring to the predetermined time, furthermore, the concentration of the gasified $SiF_4$ generated by a reaction to the by-product is directly monitored. When the predetermined cleaning end point concentration is reached, the cleaning is ended. Consequently, the cleaning can be ended more accurately at the time that the cleaning is to be completed.

Accordingly, it is possible to prevent the time required for the cleaning from being excessively shortened and to perfectly remove the by-product such as $SiO_2$ or $Si_3N_4$ stuck and deposited onto the surface of the internal wall, the electrode or the like in the reaction chamber, the piping of the gas discharging path or the like without remaining.

Even if the CVD apparatus is used repetitively, consequently, particulates can be prevented from being mixed into a semiconductor product so that a contamination is not caused. Thus, a thin film of high quality can be manufactured, the disconnection or short circuit of a semiconductor circuit can be prevented from being caused and a yield or the like can be prevented from being deteriorated.

Moreover, the time required for the cleaning can be prevented from being excessively prolonged and the cleaning gas introduced into the reaction chamber can be prevented from being exactly discharged without contributing to the cleaning.

Accordingly, the cleaning gas constituted by the fluorine containing compound such as $CF_4$ or $C_2F_6$ can be prevented from being discharged into the air and there is no possibility that an adverse influence on an environment such as global warming might be generated.

Furthermore, the luminous intensity of the F radical obtained by the optical emission spectroscopy (OES) and the F intensity obtained by the mass spectroscopy are proportional to the etching rate (cleaning rate) of the by-product. Therefore, the cleaning is maintained for a predetermined time in a state in which the cleaning efficiency is high. Consequently, the cleaning efficiency can be enhanced.

Moreover, the present invention is characterized in that the cleaning end point concentration is 100 ppm.

If the cleaning end point concentration is 100 ppm, consequently, the concentration of $SiF_4$ in the gas discharged from the reaction chamber corresponds to such a concentration as to perfectly remove the by-product such as $SiO_2$ or $Si_3N_4$ stuck and deposited onto the piping of the gas discharging path or the like in addition to the surface of the internal wall, the electrode or the like in the reaction chamber.

By causing the cleaning end point concentration to end the cleaning at 100 ppm, accordingly, it is possible to end the cleaning accurately at the time that the cleaning is to be completed. As a result, the by-product can be removed perfectly.

Furthermore, the present invention is characterized in that the Fourier transform infrared spectrometry (FTIR) is provided at a downstream side of a dry pump on the gas discharging path.

Thus, the concentration data of $SiF_4$ in the gas discharged from the piping of the gas discharging path or the like in addition to the reaction chamber are monitored. Therefore, it is possible to perfectly remove the by-product such as $SiO_2$ or $Si_3N_4$ stuck and deposited onto the piping of the gas discharging path or the like in addition to the surface of the internal wall, the electrode or the like in the reaction chamber.

Moreover, the present invention is characterized in that the mass spectroscopy is a quadrupole type mass spectroscopy (QMS) and an intensity relative value for Ar is used as an F intensity thereof.

By using the quadrupole type mass spectroscopy (QMS) as the mass spectroscopy to utilize the intensity relative value for Ar as the F intensity, thus, it is possible to measure the F radical excited to contribute to the cleaning in the reaction chamber. As a result, the cleaning in the reaction chamber can be ended at an accurate cleaning end time.

Furthermore, the present invention is characterized in that the mass spectroscopy is an ion adhesion type mass spectroscopy (IAMS) and F—Li or $F_2$—Li is used as an F intensity thereof.

If the mass spectroscopy is the ion adhesion type mass spectroscopy (IAMS) and the F—Li or the $F_2$—Li is used as the F intensity, thus, the amount of the F radical excited to contribute to the cleaning and returned to an original state again in the reaction chamber is set to be constant. Thus, the cleaning in the reaction chamber can be ended accurately at the time that the cleaning is to be completed.

BEST MODE FOR CARRYING OUT THE INVENTION

Embodiments (examples) of the present invention will be described below in more detail with reference to the drawings.

Figure 1:
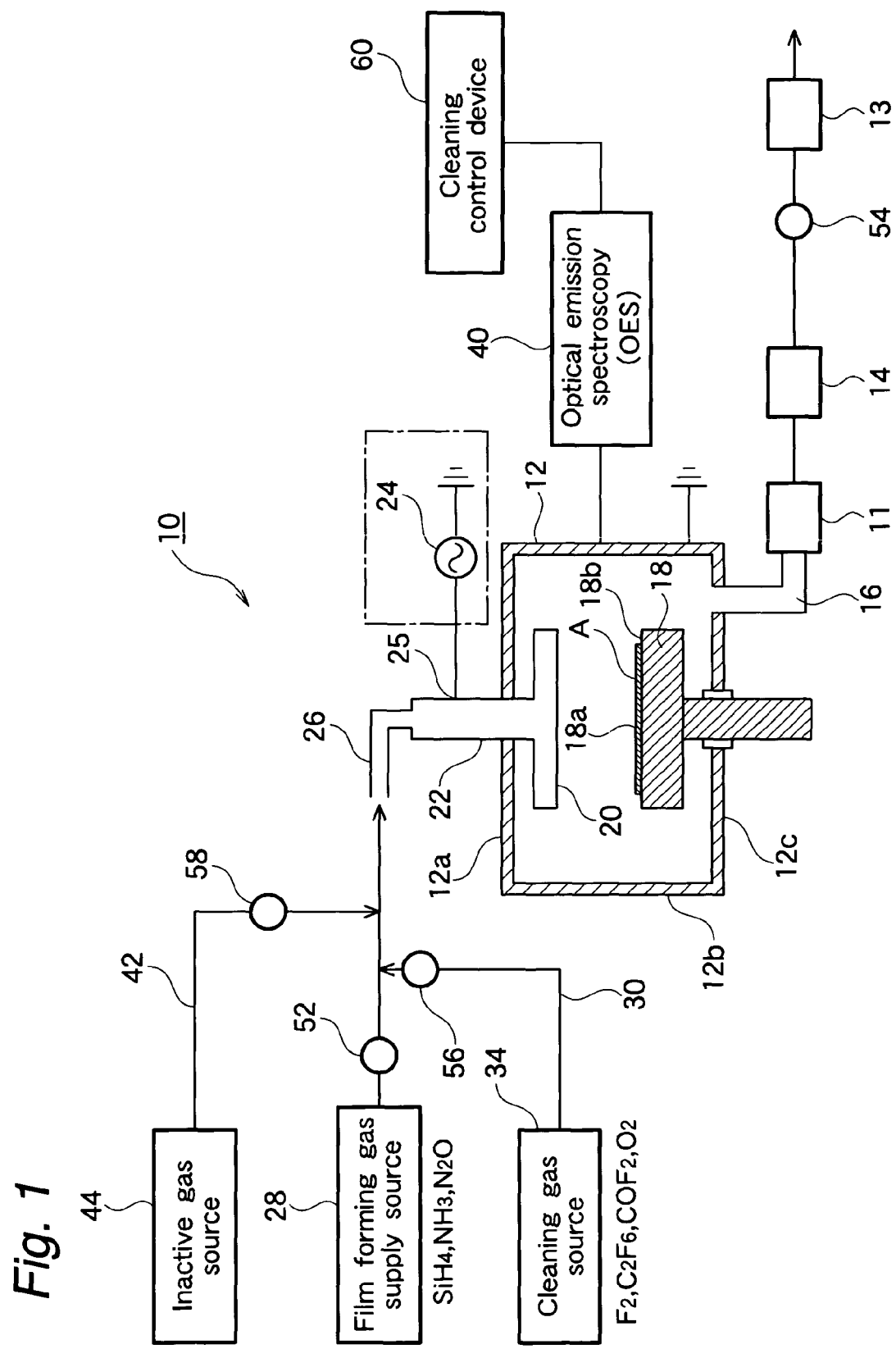
FIG. 1 is a schematic view showing an example in which an apparatus for cleaning a CVD apparatus according to the present invention is applied to the CVD apparatus.

FIG. 1 is a schematic view showing an example in which an apparatus for cleaning a CVD apparatus according to the present invention is applied to the CVD apparatus.

As shown in FIG. 1, a plasma CVD apparatus 10 to be used in a plasma CVD method comprises a reaction chamber 12 maintained in a pressure reducing state (a vacuum state), and is maintained in a constant vacuum state (a pressure reducing state) by discharging an internal gas to an outside by means of a mechanical booster pump 11, a dry pump 14 and a harm removing device 13 for causing an exhaust gas to be non-toxic through an exhaust path 16 formed on a bottom wall 12c of the reaction chamber 12.

Moreover, a lower electrode 18 constituting a stage (a counter electrode stage) for mounting a base material A to accumulate (containing deposition) a thin silicon film on the surface of a silicon wafer or the like is provided in the reaction chamber 12, for example. The lower electrode 18 penetrates through the bottom wall 12c of the reaction chamber 12 and is constituted to be vertically slidable by a driving mechanism which is not shown, and a position is thus adjustable. A seal member such as a seal ring is provided in a sliding portion between the lower electrode 18 and the bottom wall 12c in order to ensure a degree of vacuum in the reaction chamber 12, which is not shown.

On the other hand, an upper electrode 20 constituting a reactive gas introducing device is provided in the upper part of the reaction chamber 12, and a base end portion 22 thereof penetrates through a top wall 12a of the reaction chamber 12 and is connected to a high frequency power supply 24 provided on the outside of the reaction chamber 12. The upper electrode 20 is provided with a high frequency applying device 25 such as a high frequency applying coil which is not shown, and a matching circuit which is not shown is provided between the high frequency applying device 25 and the high frequency power supply 24. Consequently, a high frequency generated by the high frequency power supply 24 can be propagated to the high frequency applying device 25 such as the high frequency applying coil without a loss.

Moreover, a reactive gas supply path 26 is formed on the upper electrode 20, and a film forming gas is introduced from a film forming gas supply source 28 through the reactive gas supply path 26 and the upper electrode 20 into the reaction chamber 12 maintained in the pressure reducing state.

Furthermore, a cleaning gas supply path 30 branches and is connected to the reactive gas supply path 26 and a cleaning gas supplied from a cleaning gas source 34 can be thus introduced into the reaction chamber 12 through the cleaning gas supply path 30.

Moreover, an inactive gas supply path 42 braches and is connected to the reactive gas supply path 26 and an inactive gas such as Ar supplied from an inactive gas source 44 can be introduced into the reaction chamber 12 through the inactive gas supply path 42.

In the drawings, 52, 54, 56 and 58 denote switching valves.

The CVD apparatus 10 according to the present invention which is thus constituted is operated in the following manner.

First of all, the base material A for depositing a silicon type thin film on the surface of a silicon wafer or the like is mounted on the stage of the lower electrode 18 of the reaction chamber 12, for example, and a distance from the upper electrode 20 is adjusted to be a predetermined distance by means of a driving mechanism which is not shown.

Then, an internal gas is discharged through the dry pump 14 to an outside via the exhaust path 16 formed on the bottom wall 12c of the reaction chamber 12, thereby maintaining a constant vacuum state (a pressure reducing state), for example, a pressure reducing state of 10 to 2000 Pa.

Thereafter, the switching valve 52 provided on the reactive gas supply path 26 is opened so that the film forming gas is introduced from the film forming gas supply source 28 through the reactive gas supply path 26 and the upper electrode 20 into the reaction chamber 12 maintained in the pressure reducing state.

In this case, the switching valve 52 provided on the reactive gas supply path 26 and the switching valve 54 provided on the exhaust path 16 are opened, and the switching valve 56 provided on the cleaning gas supply path 30 and the switching valve 58 provided on the inactive gas supply path 42 are closed.

In this case, it is preferable to supply monosilane ($SiH_4$), $N_2O$, $N_2$, $O_2$, Ar or the like in the formation of the film of silicon oxide ($SiO_2$) and monosilane ($SiH_4$), $NH_3$, $N_2$ $O_2$ and Ar in the formation of the film of silicon nitride ($Si_3N_4$ or the like) as a film forming gas to be supplied from the film forming gas supply source 28, for example. However, the film forming gas is not restricted thereto but a proper change can be carried out, that is, it is possible to use disilane ($Si_2H_6$), TEOS (tetraethoxysilane; $Si(OC_2H_5)_4$) or the like for the film forming gas and $O_2$, $O_3$ or the like for a carrier gas depending on the type of a thin film to be formed, for example.

A high frequency is generated from the high frequency power supply 24 and a high frequency electric field is generated on the upper electrode 20 from the high frequency applying device 25 such as the high frequency applying coil, and an electron is caused to collide with the neutral molecule of the film forming gas in the electric field so that a high frequency plasma is formed and the film forming gas is thus decomposed into an ion and a radical. By the action of the ion and the radical, a silicon type thin film is formed on the surface of the base material A such as a silicon wafer which is provided on the lower electrode 18.

In such a CVD apparatus 10, in the film forming process, a thin film material such as $SiO_2$ or $Si_3N_4$ is also stuck and deposited onto the surface of an internal wall, an electrode or the like in the reaction chamber 12 not only the base material A to form a film by a discharge in the reaction chamber 12 so that a by-product is formed. When the by-product grows to have a constant thickness, it is peeled and scattered by a dead weight, a stress or the like. In the film forming process, consequently, particulates are mixed as foreign matters into a semiconductor product so that a contamination is caused. Consequently, a thin film of high quality cannot be manufactured. Thus, the disconnection or short circuit of a semiconductor circuit is caused, and furthermore, a yield or the like might be deteriorated.

For this reason, in the CVD apparatus 10 according to the present invention, a fluorine type cleaning gas having a fluorine containing compound, that is, a cleaning gas supplied from the cleaning gas source 34 is introduced into the reaction chamber 12 through the cleaning gas supply path 30 and the reactive gas supply path 26.

More specifically, after the thin film process is ended as described above, the switching valve 52 provided on the reactive gas supply path 26 is closed to stop the supply of the film forming gas from the film forming gas supply source 28 into the reaction chamber 12.

Then, the switching valve 56 provided on the cleaning gas supply path 30 is opened to introduce the cleaning gas from the cleaning gas source 34 into the reaction chamber 12 through the cleaning gas supply path 30 and the reactive gas supply path 26.

Thereafter, a high frequency is generated from the high frequency power supply 24 and a high frequency electric field is generated on the upper electrode 20 from the high frequency applying device 25 such as a high frequency applying coil so that a high frequency plasma is formed.

Consequently, the cleaning gas introduced into the reaction chamber 12 is decomposed into an ion and a radical. The ion or the radical reacts to a by-product such as $SiO_2$ or $Si_3N_4$ stuck and deposited onto a side wall 12b of the reaction chamber 12 and an outer peripheral portion 18b of a surface 18a of the lower electrode 18 so that the by-product is gasified as $SiF_4$.

Thus, the by-product such as $SiO_2$ or $Si_3N_4$ stuck and deposited onto the side wall 12b of the reaction chamber 12 and the outer peripheral portion 18b of the surface 18a of the lower electrode 18 is gasified as $SiF_4$ by the cleaning gas introduced into the reaction chamber 12.

Subsequently, the by-product changed into the gas discharges an internal gas to an outside by means of the mechanical booster pump 11, the dry pump 14 and the harm removing device 13 for causing an exhaust gas to be non-toxic through the exhaust path 16 formed on the bottom wall 12c of the reaction chamber 12.

Thus, the by-product stuck and deposited onto the side wall 12b of the reaction chamber 12 and the outer peripheral portion 18b of the surface 18a of the lower electrode 18 is removed by the cleaning gas introduced into the reaction chamber 12 and the switching valve 56 provided on the cleaning gas supply path 30 is then closed to stop the introduction of the cleaning gas from the cleaning gas source 34.

Accordingly, the by-product stuck and deposited into the reaction chamber 12 can be removed perfectly. Consequently, it is possible to manufacture a thin film of high quality.

Moreover, the switching valve 54 provided on the exhaust path 16 is opened, and furthermore, the switching valve 52 provided on the reactive gas supply path 26 is opened to start the supply of a film forming gas from the film forming gas supply source 28 into the reaction chamber 12. Thus, the film forming process cycle is started again.

In this case, examples of a fluorine type cleaning gas containing a fluorine compound to be used for a cleaning process include perfluorocarbons having a carbon atomic number of 1 to 6, for example:

chain aliphatic perfluorocarbons such as $CF_4$, $C_2F_6$, $C_3F_8$, $C_4F_{10}$, $C_5F_{12}$ or the like;

alicyclic perfluorocarbons such as $C_4F_8$, $C_5F_{10}$, $C_6F_{12}$ or the like;

straight chain perfluoroethers such as $CF_3OCF_3$, $CF_3OC_2F_5$, $C_2F_5OC_2F_5$ or the like;

circular perfluoroethers such as $C_3F_6O$, $C_4F_8O$, $C_5F_{10}O$ or the like;

unsaturated perfluorocarbons such as $C_3F_6$, $C_4F_8$, $C_5F_{10}$ or the like; and diene type perfluorocarbons such as $C_4F_6$, $C_5F_8$ or the like.

Moreover, it is also possible to use perfluorocarbons containing oxygen such as $COF_2$, $CF_3COF$, $CF_3°F$. or the like, and fluorine compounds containing nitrogen such as $NF_3$, $FNO$, $F_3NO$, $FNO_2$ or the like and preferably fluorine compounds containing oxygen and nitrogen, or the like.

These fluorine containing compounds may contain at least one fluorine atom having a part substituted for a hydrogen atom. It is preferable to use $CF_4$, $C_2F_6$ and $C_3F_8$, and more preferable to use $CF_4$ and $C_2F_6$.

These fluorine containing compounds can be used singly or in combination.

Moreover, the cleaning gas having the fluorine containing compound to be used in the present invention can be used by properly mixing other gases within such a range that the advantages of the present invention are not damaged. Examples of the other gases include He, Ne, Ar, $O_2$ and the like. The amounts of blending of the other gases are not particularly restricted but they can be determined corresponding to the amount and thickness of a by-product (an adherend) stuck to the internal wall of the reaction chamber 12 in the CVD apparatus 10 or the like, the type of a fluorine containing compound to be used, the composition of the by-product or the like.

For a cleaning gas to be used for a cleaning process, furthermore, it is possible to use a fluorine gas ($F_2$) in addition to a fluorine type cleaning gas containing the fluorine compound.

More specifically, an additional gas such as oxygen or argon is usually mixed in a proper amount and is thus used together with the cleaning gas in the plasma cleaning.

Referring to a mixed gas type of the cleaning gas and the additional gas, when the concentration of content of the cleaning gas is increased on a condition that a total gas flow is constant, an etching speed tends to be increased. However, there is a problem in that the generation of a plasma becomes unstable, the etching speed is reduced, and a cleaning uniformity is deteriorated when the concentration of the cleaning gas exceeds a constant concentration. In particular, when the cleaning gas is used in a concentration of 100%, the instability of the generation of the plasma, the reduction in the etching speed, and the deterioration in the cleaning uniformity tend to be more remarkable. Consequently, there is a problem in that a utility cannot be obtained.

For this reason, it is necessary to carry out a dilution to set the concentration of the cleaning gas to be low, that is, a concentration at the peak of an etching speed—cleaning gas concentration curve or less for use. In order to suppress a reduction in the etching speed which is caused by the dilution, a chamber pressure in the cleaning is raised or a gas flow is increased so that the cleaning condition is optimized. When the chamber pressure in the cleaning is thus raised or the gas flow is increased, however, the generation of a plasma becomes unstable and the cleaning uniformity is damaged so that efficient cleaning cannot be carried out.

On the other hand, when the fluorine gas or the mixed gas of the fluorine gas and a gas which does not substantially react to fluorine in the plasma is used as the cleaning gas, the plasma treatment can be carried out so that a very high etching speed can be obtained. In addition, the plasma can be generated stably on the condition that a total gas flow is set to be approximately 1000 sccm and a chamber pressure is set to be approximately 400 Pa, and furthermore, an excellent cleaning uniformity can be ensured.

It is desirable that the fluorine gas to be used as the cleaning gas should have 100% by volume and should generate a plasma by a discharge.

Moreover, the cleaning gas may be constituted by a fluorine gas for generating a plasma by a discharge and a gas which does not substantially react to fluorine in the plasma.

In this case, it is preferable that the concentration of the fluorine gas for generating the plasma by the discharge should be higher than 20% by volume and lower than 100% by volume, and the concentration of a gas which does not substantially react to the fluorine in the plasma should be higher than 0% by volume and equal to or lower than 80% by volume (the fluorine gas for generating the plasma by the discharge+ the gas which does not substantially react to the fluorine=100% by volume).

Moreover, it is more preferable that the concentration of the fluorine gas for generating the plasma by the discharge should be higher than 30% by volume and lower than 100% by volume, and the concentration of a gas which does not substantially react to the fluorine in the plasma should be higher than 0% by volume and equal to or lower than 70% by volume (the fluorine gas for generating the plasma by the discharge+the gas which does not substantially react to the fluorine=100% by volume).

Furthermore, it is preferable that the gas which does not substantially react to the fluorine in the plasma should be at least one selected from a group consisting of nitrogen, oxygen, carbon dioxide, $N_2O$, dry air, argon, helium and neon.

In this case, the "fluorine" in the gas which does not substantially react to the fluorine contains a fluorine molecule, a fluorine atom, a fluorine radical, a fluorine ion and the like.

Examples of a target compound for chamber cleaning by the fluorine type compound include an adherend consisting of a silicon type compound which is stuck to a CVD chamber wall, the jig of a CVD apparatus or the like through a CVD method or the like. Referring to the adherend of the silicon type compound, at least one of the following compounds can be taken as an example:

(1) a compound consisting of silicon;
(2) a compound consisting of at least one of oxygen, nitrogen, fluorine and carbon, and silicon; and
(3) a compound consisting of a high-melting metal silicide. More specifically, examples include high-melting metal silicides such as Si, $SiO_2$, $Si_3N_4$ and WSi.

In consideration of advantages obtained by carrying out the cleaning over the by-product stuck to the internal wall of the reaction chamber 12, moreover, it is desirable that the flow of the introduction of the cleaning gas into the reaction chamber 12 should be 0.1 to 10 L/minute, and preferably, 0.5 to 1 L/minute. More specifically, if the flow of the introduction of the cleaning gas into the reaction chamber 12 is smaller than 0.1 L/minute, the cleaning effects cannot be expected. To the contrary, if the flow of the introduction is greater than 10 L/minute, the amount of the cleaning gas to be discharged to the outside is increased without contributing to the cleaning.

The flow of the introduction can be properly changed depending on the type and size of the base material A, for example, a flat panel disk or the like. As an example, if the fluorine containing compound is $C_2F_6$, it is preferable to set 0.5 to 5 L/minute.

In consideration of advantages obtained by carrying out the cleaning over the by-product stuck to the internal wall of the reaction chamber 12, furthermore, it is desirable that the pressure of the cleaning gas in the reaction chamber 12 should be 10 to 2000 Pa, and preferably, 50 to 500 Pa. More specifically, if the pressure of the cleaning gas in the reaction chamber 12 is lower than 10 Pa or is higher than 2000 Pa, the cleaning effects cannot be expected. The pressure in the reaction chamber 12 can be properly changed depending on the type and size of the base material A, for example, a flat panel disk or the like. As an example, if the fluorine containing compound is $C_2F_6$, it is preferable to set 100 to 500 Pa.

Under the existing circumstances, in such cleaning, the time required for the cleaning is experimentally determined to end the cleaning.

If the time required for the cleaning is too short, accordingly, the by-product such as $SiO_2$ or $Si_3N_4$ stuck and deposited onto the surface of the internal wall, the electrode or the like in the reaction chamber 12 remains. When the CVD apparatus is used repetitively, consequently, particulates are mixed into a semiconductor product, resulting in a contamination as described above. Therefore, a thin film of high quality cannot be manufactured so that the disconnection or short circuit of a semiconductor circuit is caused, and furthermore, a yield or the like is also deteriorated.

To the contrary, if the time required for the cleaning is too long, the cleaning gas introduced into the reaction chamber 12 is exactly discharged without contributing to the cleaning. For this reason, a cleaning gas constituted by a fluorine containing compound such as $CF_4$, $C_2F_6$ or $COF_2$ is discharged into the air. Consequently, there is a possibility that an environment might be adversely influenced.

In the present invention, therefore, an optical emission spectroscopy (OES) 40 for carrying out an optical emission spectral analysis over an F radical in the reaction chamber 12 to measure a luminous intensity is additionally provided between the side part of the reaction chamber 12 and the side wall 12b of the reaction chamber 12 as shown in FIG. 1.

Figure 2:
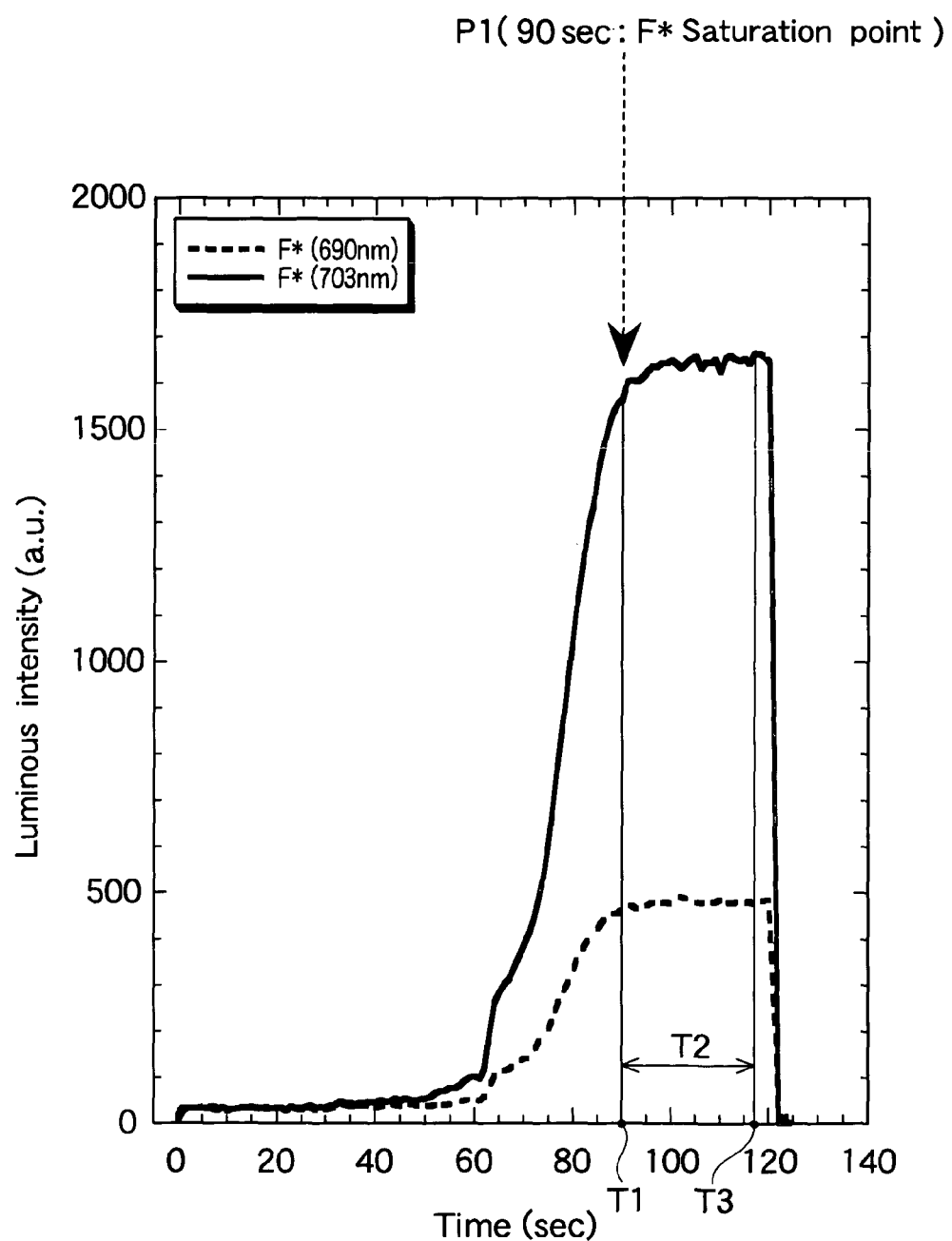
FIG. 2 is a graph showing a relationship between a time and a luminous intensity.

More specifically, the luminous intensity of the F radical in the reaction chamber 12 reaches a luminous intensity saturation point P1 after 90 seconds in the present example as shown in a graph illustrating a time—luminous intensity in FIG. 2. The luminous intensity data of the F radical in the reaction chamber 12 are monitored by means of the optical emission spectroscopy (OES) 40 and are compared with prestored luminous intensity data by means of a cleaning control device 60 to decide whether or not the luminous intensity saturation point is reached.

A control is carried out by the cleaning control device 60 in such a manner that the cleaning is ended after a predetermined time T2 since the luminous intensity saturation point P1 is reached.

More specifically, the amount of the F radical excited to contribute to the cleaning and returned to an original state again in the reaction chamber 12 is set to be constant. Consequently, the cleaning in the reaction chamber can be ended accurately at a time that the cleaning is to be completed.

In addition, the cleaning is ended at a time T3 after the predetermined time T2 passes since the time T1 that the luminous intensity saturation point P1 is reached. Therefore, it is possible to carry out the cleaning over the by-product such as $SiO_2$ or $Si_3N_4$ which is also stuck and deposited onto the piping of a gas discharging path or the like, thereby ending the cleaning accurately at the time that the cleaning is to be completed.

Accordingly, it is possible to prevent the time required for the cleaning from being excessively shortened, and to perfectly remove the by-product such as $SiO_2$ or $Si_3N_4$ stuck and deposited onto the surface of the internal wall, the electrode or the like in the reaction chamber, the piping of the gas discharging path or the like without remaining.

Even if the CVD apparatus is used repetitively, consequently, the mixture of particulates into a semiconductor product and a contamination are not caused. Thus, a thin film of high quality can be manufactured and the disconnection or short circuit of a semiconductor circuit can be prevented from being caused so that a yield or the like can be prevented from being deteriorated.

Moreover, it is possible to prevent the time required for the cleaning from being excessively prolonged, and to inhibit the cleaning gas introduced into the reaction chamber 12 from being exactly discharged without contributing to the cleaning.

Accordingly, the cleaning gas constituted by a fluorine containing compound such as $CF_4$ or $C_2F_6$ can be prevented from being discharged into the air. Thus, there is no possibility that a bad influence on an environment such as global warming might be caused.

While such a predetermined time T2 depends on the size of the reaction chamber 12 in the CVD apparatus 10, it is desirable that a time after the passage to be 15 to 50 seconds, and preferable that a time after the passage to be 20 to 30 seconds based on the concentration data of $SiF_4$ in the gas discharged from the reaction chamber through a Fourier transform infrared spectrometry as shown in a graph of FIG. 6 as will be described below in order to perfectly remove the by-product such as $SiO_2$ or $Si_3N_4$ stuck and deposited onto the surface of the internal wall, the electrode or the like in the reaction chamber, the piping of the gas discharging path or the like without remaining.

Figure 3:
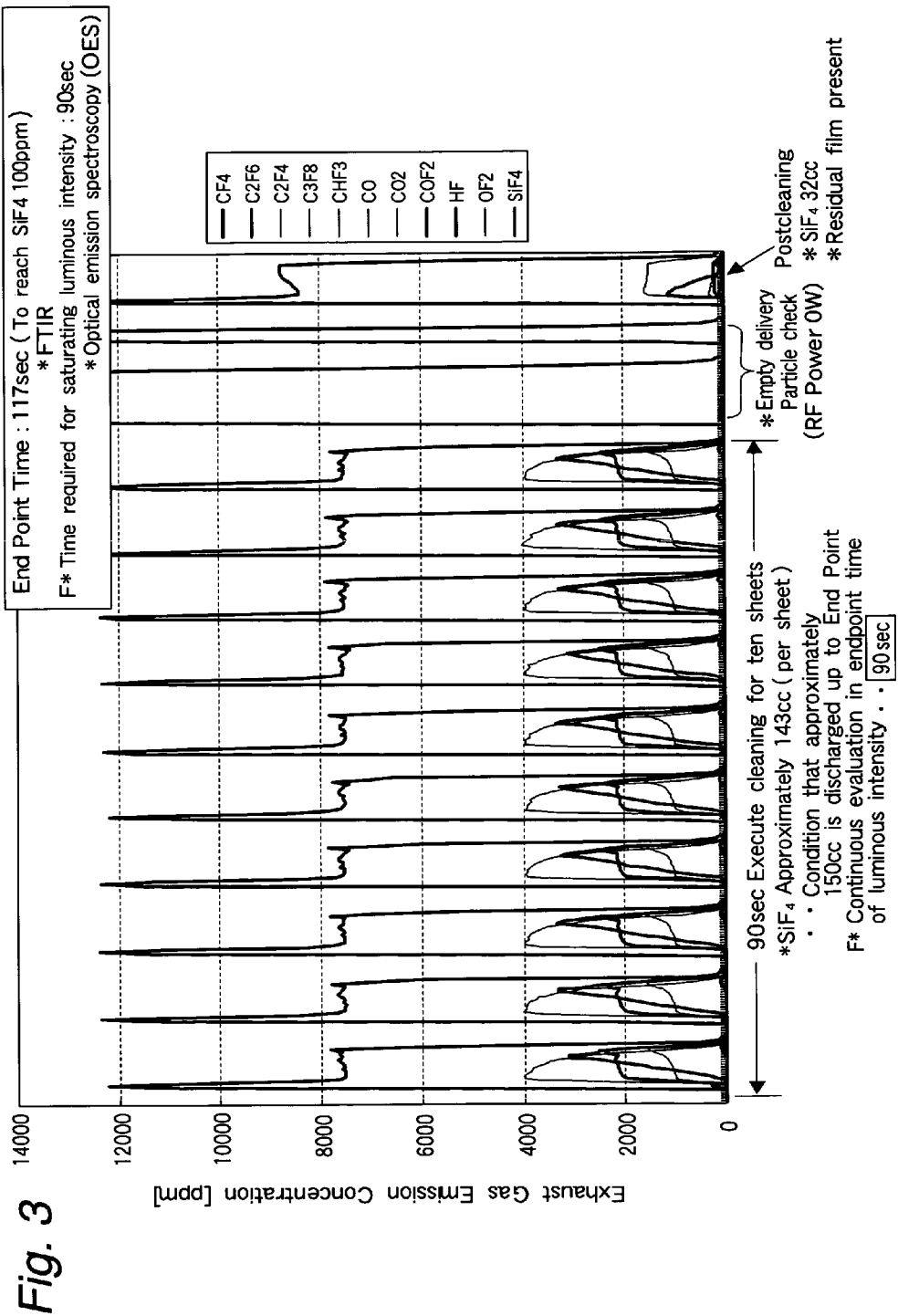
FIG. 3 is a graph showing a relationship between a time and a discharged gas concentration, illustrating a state in which cleaning is repeated, and to be ended at a time T1 (90 seconds) that a luminous intensity saturation point P1 is reached.

More specifically, as shown in a graph of FIG. 3, the cleaning was carried out after the treatment of ten semiconductor wafers so as to be ended at the time T1 (90 seconds) that the luminous intensity saturation point P1 is reached. Consequently, it has been confirmed that the by-product such as $SiO_2$ or $Si_3N_4$ remains on the surface of the internal wall, the electrode or the like in the reaction chamber, the piping of the gas discharging path or the like as shown in a place of Post-cleaning.

Figure 4:
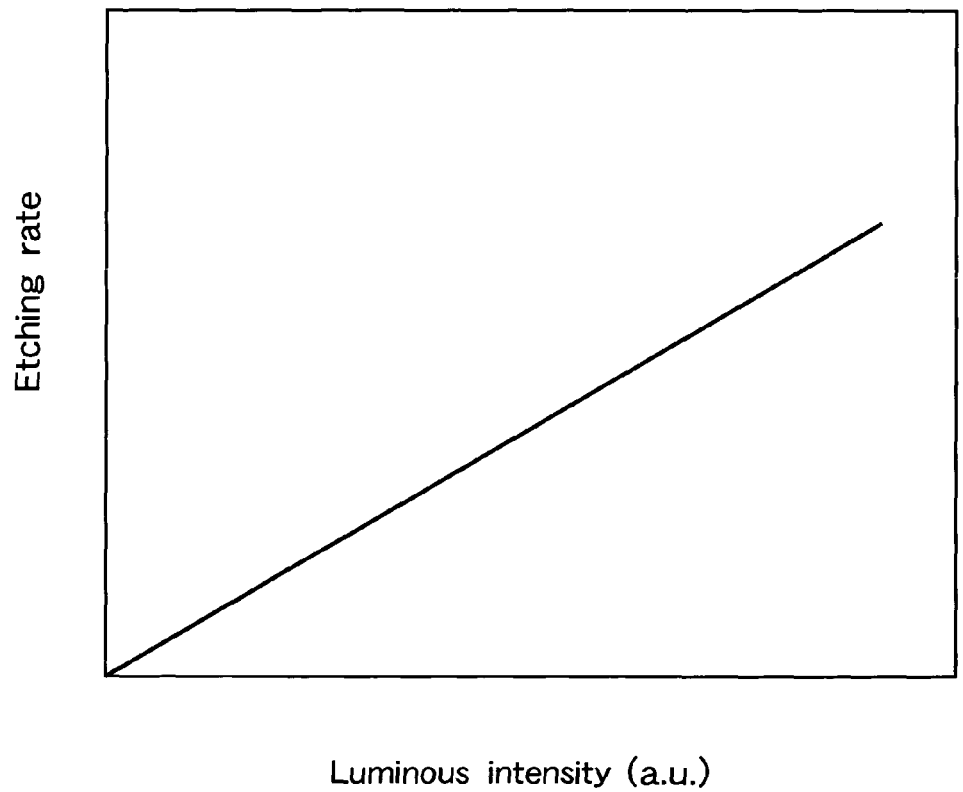
FIG. 4 is a graph showing a relationship between the luminous intensity of an F radical and the etching rate (cleaning rate) of a by-product.

As shown in a graph of FIG. 4, furthermore, the luminous intensity of the F radical obtained by the optical emission spectroscopy (OES) and the etching rate (cleaning rate) of the by-product are proportional to each other. Therefore, the cleaning is maintained for a predetermined time in a state in which a cleaning efficiency is high. Consequently, the cleaning efficiency can be enhanced.

Such an optical emission spectroscopy (OES) is not particularly restricted but "Plasma Process Monitor C7460" manufactured by Hamamatsu Photonics K.K. or the like can be used, for example.

Figure 5:
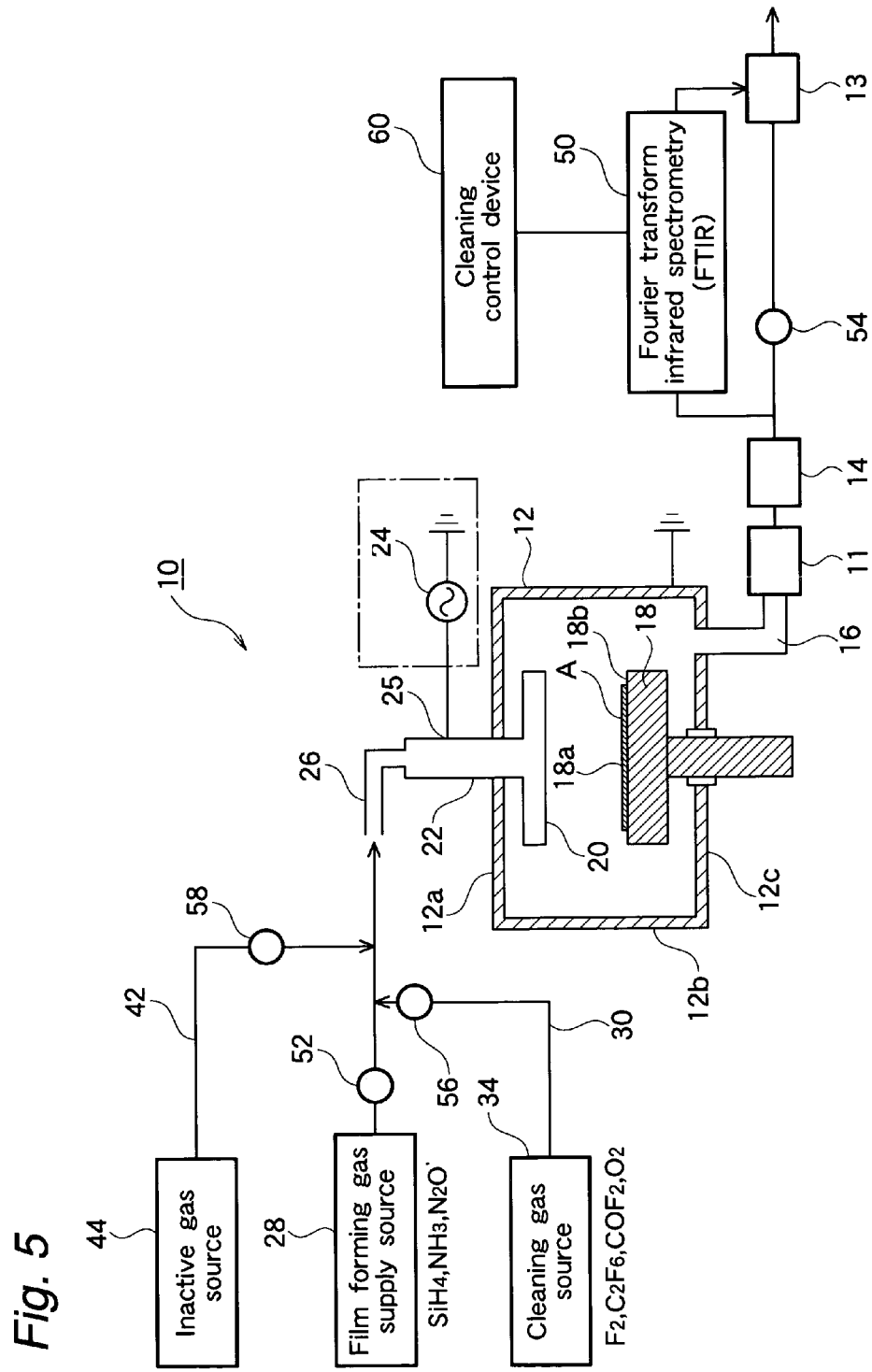
FIG. 5 is a schematic view showing another example in which the apparatus for cleaning a CVD apparatus according to the present invention is applied to the CVD apparatus.

FIG. 5 is a schematic view showing another example in which the apparatus for cleaning a CVD apparatus according to the present invention is applied to the CVD apparatus.

A CVD apparatus 10 according to the present example has basically the same structure as that of the CVD apparatus 10 shown in FIG. 1, and the same components have the same reference numerals and detailed description thereof will be omitted.

In the CVD apparatus 10 according to the example of FIG. 1, the optical emission spectroscopy (OES) 40 for carrying out the optical emission spectral analysis of the F radical in the reaction chamber 12 to measure a luminous intensity is additionally provided between the side part of the reaction chamber 12 and the side wall 12b of the reaction chamber 12.

On the other hand, in the CVD apparatus 10 according to the present example, the optical emission spectroscopy (OES) 40 is not provided but a Fourier transform infrared spectrometry (FTIR) 50 for analyzing an exhaust gas component is provided between a dry pump 14 and a harm removing device 13 at the downstream side of the dry pump 14 on an exhaust path 16, which is a gas discharging path as shown in FIG. 5.

Figure 6:
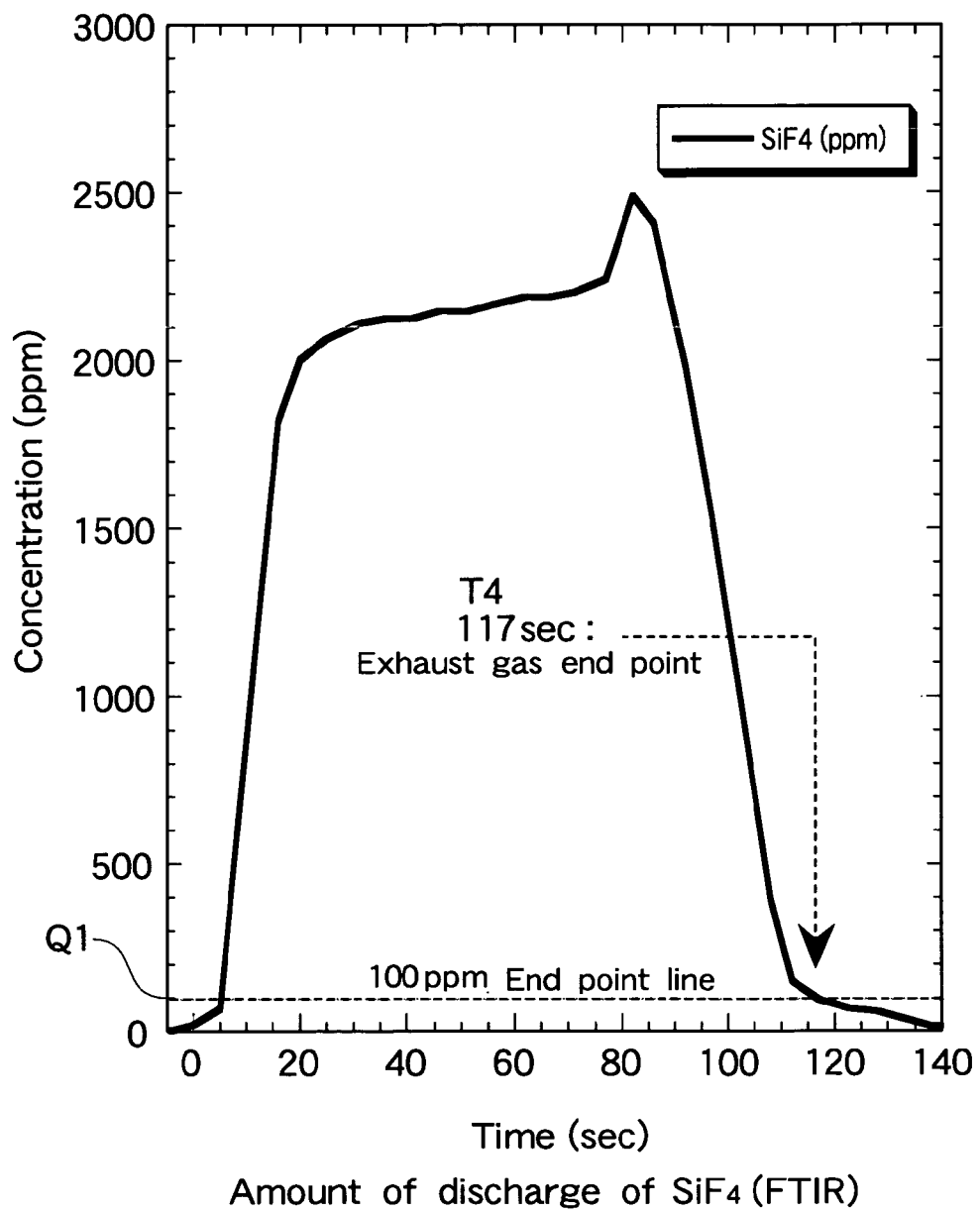
FIG. 6 is a graph showing a relationship between a time and a concentration (the concentration of $SiF_4$)

More specifically, as shown in the graph of a time—concentration (the concentration of $SiF_4$) in FIG. 6, the concentration of $SiF_4$ in a gas discharged from a reaction chamber 12 reaches a constant level Q1 or less at a predetermined time T4.

Accordingly, a structure in which the concentration data of $SiF_4$ in the gas discharged from the reaction chamber 12 are monitored by means of the Fourier transform infrared spectrometry 50 and are compared with prestored concentration data of $SiF_4$, and cleaning is controlled to be ended in a cleaning control device 60 at the time T4 that the predetermined cleaning end point concentration Q1 is reached, is employed.

By such a structure, the concentration of the gasified $SiF_4$ generated by a reaction to a by-product such as $SiO_2$ or $Si_3N_4$ stuck and deposited onto the surface of an internal wall, an electrode or the like in the reaction chamber, the piping of the gas discharging path or the like in the cleaning is monitored directly. Consequently, the cleaning can be ended accurately at a time that the cleaning is to be completed.

Accordingly, it is possible to prevent the time required for the cleaning from being excessively shortened, and to perfectly remove the by-product such as $SiO_2$ or $Si_3N_4$ stuck and deposited onto the surface of the internal wall, the electrode or the like in the reaction chamber, the piping of the gas discharging path or the like without remaining.

Even if the CVD apparatus is used repetitively, consequently, the mixture of particulates into a semiconductor product and a contamination are not caused. Thus, a thin film of high quality can be manufactured and the disconnection or short circuit of a semiconductor circuit can be prevented from being caused so that a yield or the like can be prevented from being deteriorated.

Moreover, it is possible to prevent the time required for the cleaning from being excessively prolonged, and to inhibit the cleaning gas introduced into the reaction chamber from being exactly discharged without contributing to the cleaning.

Accordingly, the cleaning gas constituted by a fluorine containing compound such as $CF_4$ or $C_2F_6$ can be prevented from being discharged into the air. Thus, there is no possibility that a bad influence on an environment such as global warming might be caused.

In this case, while the cleaning end point concentration depends on the size of the reaction chamber 12 in the CVD apparatus 10, it is desirably set to be 100 ppm in order to perfectly remove the by-product such as $SiO_2$ or $Si_3N_4$ stuck and deposited onto the surface of the internal wall, the electrode or the like in the reaction chamber, the piping of the gas discharging path or the like without remaining.

If the cleaning end point concentration is 100 ppm, consequently, the concentration of $SiF_4$ in the gas discharged from the reaction chamber corresponds to such a concentration as to perfectly remove the by-product such as $SiO_2$ or $Si_3N_4$ stuck and deposited onto the piping of the gas discharging path or the like in addition to the surface of the internal wall, the electrode or the like in the reaction chamber.

Therefore, the cleaning is ended in a cleaning end point concentration of 100 ppm. Consequently, the cleaning can be ended accurately at the time T4 (after 117 seconds in the present example) that the cleaning is to be completed. As a result, the by-product can be removed perfectly.

By such a structure, furthermore, it is hard to apply to a remote plasma CVD apparatus in the example shown in FIG. 1. However, the apparatus for cleaning a CVD apparatus according to the present example can be applied to the remote plasma CVD apparatus in addition to the parallel plate type plasma CVD apparatus shown in FIG. 1.

While such a Fourier transform infrared spectrometry (FTIR) is not particularly restricted, "IGA-2000" manufactured by MIDAC Co., Ltd. or the like can be used, for example.

Figure 7:
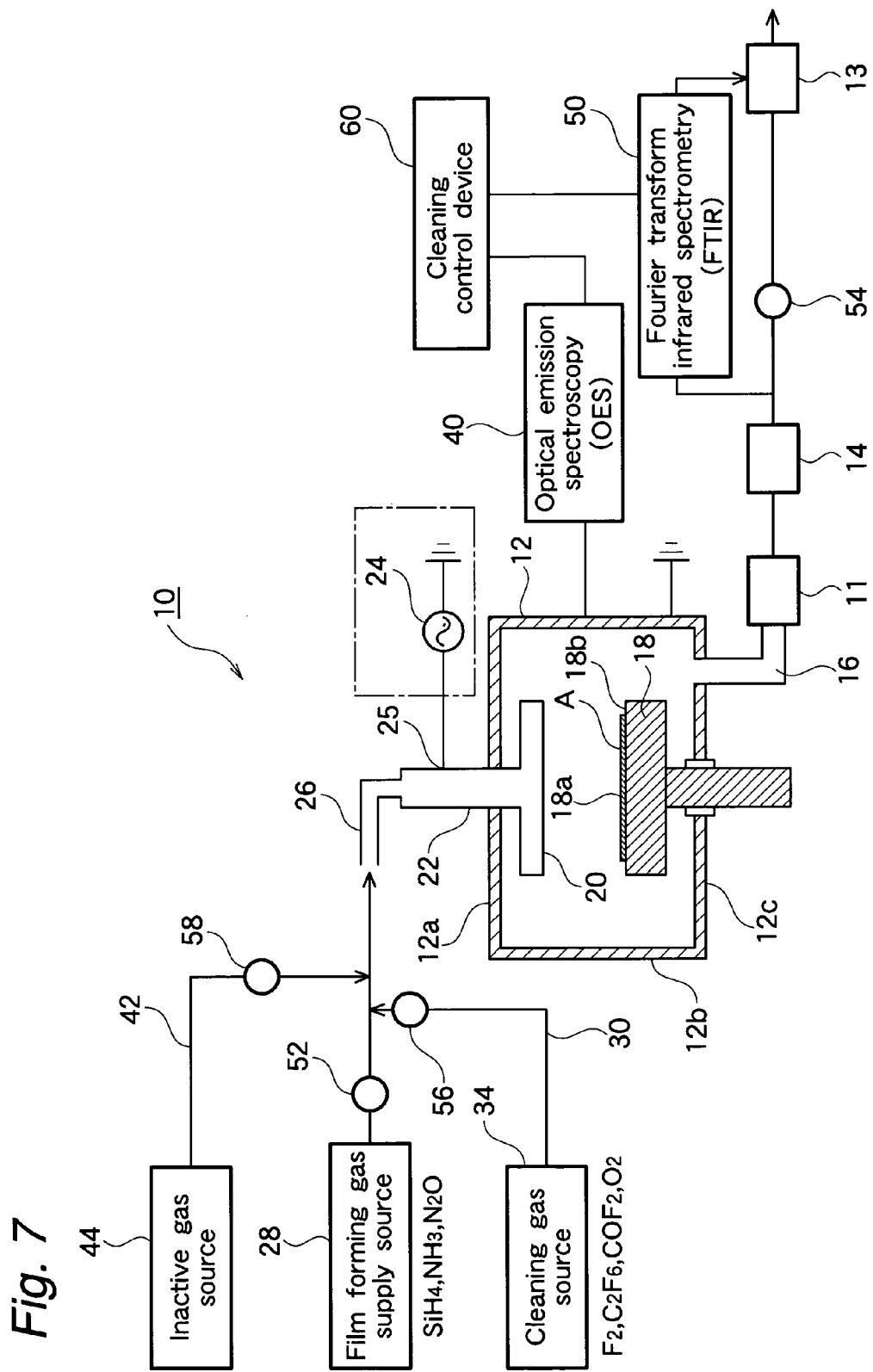
FIG. 7 is a schematic view showing yet another example in which the apparatus for cleaning a CVD apparatus according to the present invention is applied to the CVD apparatus.

FIG. 7 is a schematic view showing yet another example in which the apparatus for cleaning a CVD apparatus according to the present invention is applied to the CVD apparatus.

A CVD apparatus 10 according to the present example has basically the same structure as that of the CVD apparatus 10 shown in FIGS. 1 and 5, and the same components have the same reference numerals and detailed description thereof will be omitted.

In the CVD apparatus 10 according to the present example, an optical emission spectroscopy (OES) 40 for carrying out the optical emission spectral analysis of an F radical in a reaction chamber 12 to measure a luminous intensity is additionally provided between the side part of the reaction chamber 12 and a side wall 12b of the reaction chamber 12 in the same manner as in the CVD apparatus 10 according to the example in FIG. 1.

In the CVD apparatus 10 according to the present example, moreover, a Fourier transform infrared spectrometry (FTIR) 50 for analyzing an exhaust gas component is provided between a dry pump 14 and a harm removing device 13 at the downstream side of the dry pump 14 on an exhaust path 16 to be a gas discharging path in the same manner as in the CVD apparatus 10 according to the example in FIG. 5.

More specifically, in the CVD apparatus 10 according to the present example, the luminous intensity of the F radical in the reaction chamber 12 reaches a luminous intensity saturation point P1 after 90 seconds in the present example as shown in the graph of the time-luminous intensity in FIG. 2. The luminous intensity data of the F radical in the reaction chamber 12 are monitored by the optical emission spectroscopy (OES) 40 and are compared with prestored luminous intensity data through a cleaning control device 60 to decide whether or not the luminous intensity saturation point is reached.

A structure in which the cleaning is carried out continuously, and furthermore, the concentration data of $SiF_4$ in a gas discharged from the reaction chamber 12 are monitored by means of the Fourier transform infrared spectrometry and are compared with prestored concentration data of $SiF_4$ in the cleaning control device 60 to carry out a control to end the cleaning at a time T4 that a predetermined cleaning end point concentration Q1 is reached, is employed.

Thus, the luminous intensity data of the F radical in the reaction chamber are monitored by means of the optical emission spectroscopy 40 and are compared with the prestored luminous intensity data. When the luminous intensity saturation point is reached, the concentration data of $SiF_4$ in the gas discharged from the reaction chamber are monitored by means of the Fourier transform infrared spectrometry. When the predetermined cleaning end point concentration is reached, consequently, it is decided that a predetermined time has passed and the cleaning is thus ended.

Accordingly, the amount of the F radical excited to contribute to the cleaning and returned to an original state again in the reaction chamber is set to be constant. Consequently, it is possible to accurately end the cleaning in the reaction chamber at the time that the cleaning is to be completed.

In addition, the cleaning is ended after the predetermined time passes since the luminous intensity saturation point is reached. Therefore, it is possible to carry out the cleaning over a by-product such as $SiO_2$ or $Si_3N_4$ stuck and deposited onto the piping of a gas discharging path or the like, thereby ending the cleaning accurately at the time that the cleaning is to be completed.

Referring to the predetermined time, furthermore, the concentration of the gasified $SiF_4$ generated by a reaction to the by-product is directly monitored. When the predetermined cleaning end point concentration is reached, the cleaning is ended. Consequently, the cleaning can be ended more accurately at the time that the cleaning is to be completed.

Figure 8:
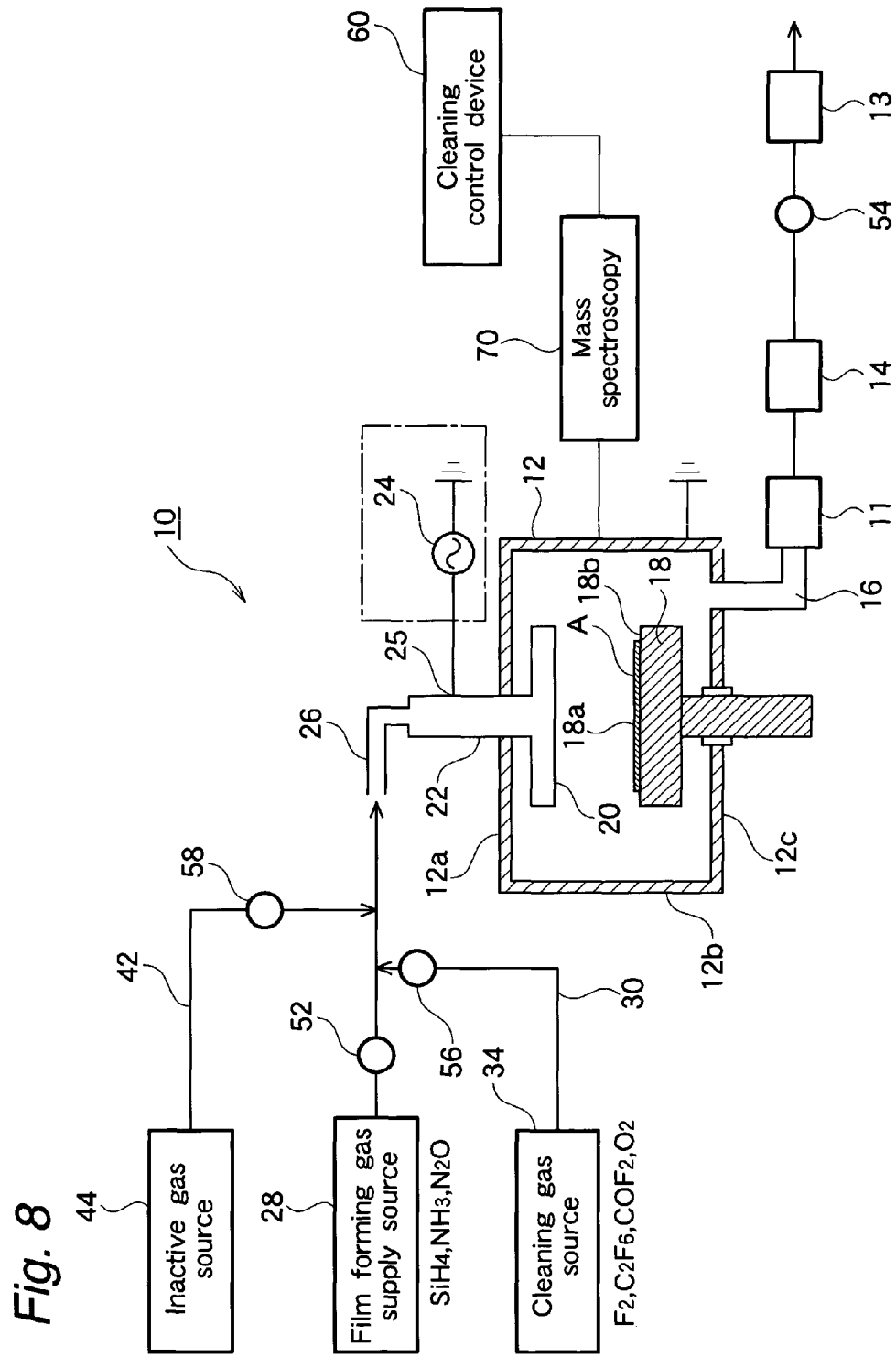
FIG. 8 is a schematic view showing a further example in which the apparatus for cleaning a CVD apparatus according to the present invention is applied to the CVD apparatus.

FIG. 8 is a schematic view showing a further example in which the apparatus for cleaning a CVD apparatus according to the present invention is applied to the CVD apparatus.

A CVD apparatus 10 according to the present example has basically the same structure as that of the CVD apparatus 10 shown in FIG. 1, and the same components have the same reference numerals and detailed description thereof will be omitted.

In the CVD apparatus 10 according to the present example, a mass spectroscopy 70 for measuring an F intensity in a reaction chamber 12 is additionally provided on a piping branching from a side wall 12*b* of the reaction chamber 12 in place of the optical emission spectroscopy (OES) 40 of the CVD apparatus 10 according to the example in FIG. 1.

In this case, it is desirable that the mass spectroscopy 70 should be a quadrupole type mass spectroscopy (QMS) and an intensity relative value for Ar should be used as the F intensity.

Figure 9:
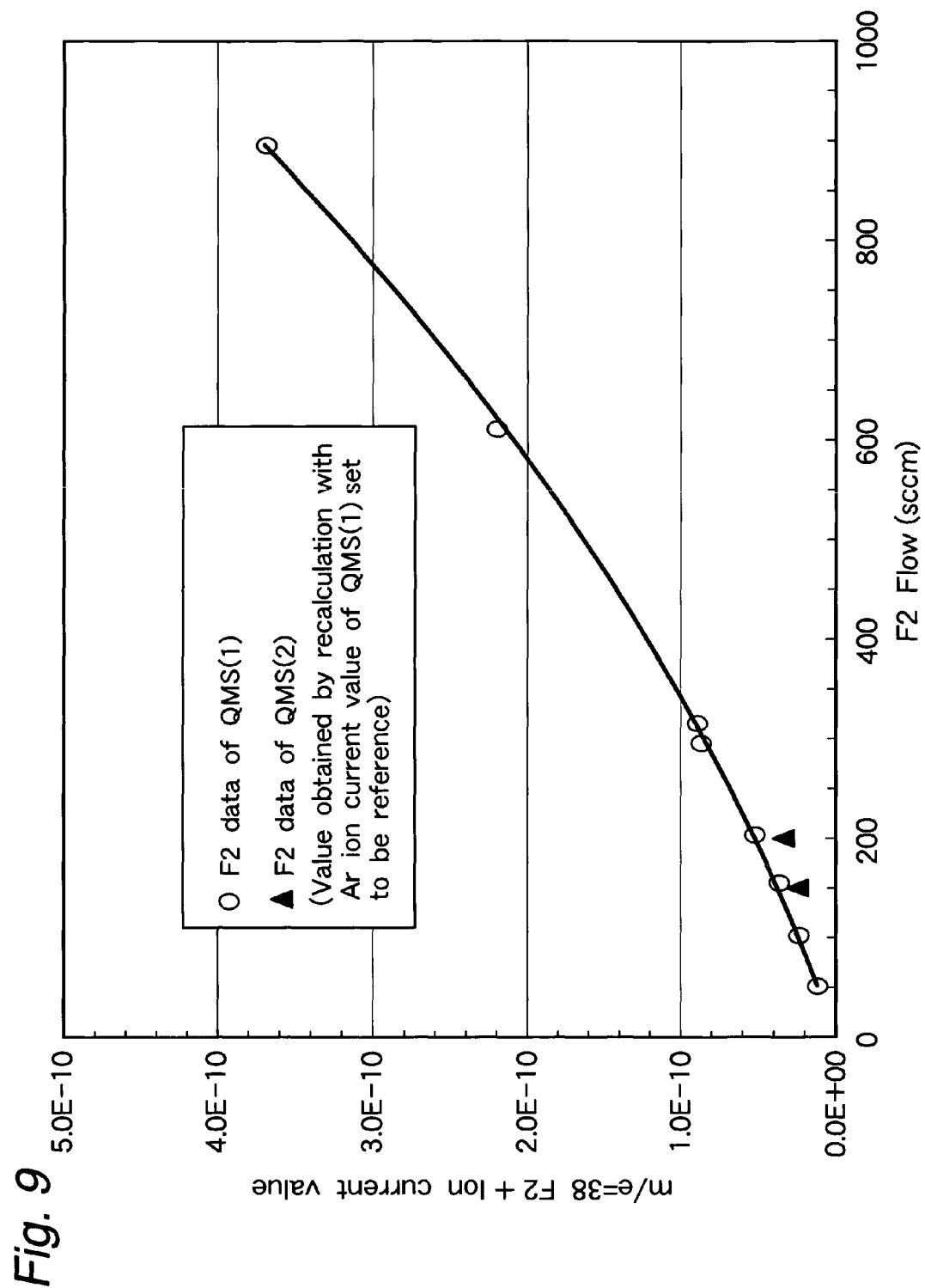
FIG. 9 is a graph showing the relationship of an $F_2$ calibration curve in a quadrupole type mass spectroscopy (QMS)

More specifically, as shown in FIG. 9, the present inventors created an $F_2$ calibration curve which can be used in each mass spectroscopy and carried out an experiment for a measuring (analyzing) method. In other words, the creation of the $F_2$ calibration curve and a method for quantifying an $F_2$ gas were investigated by using two types of quadrupole type mass spectroscopies.

More specifically, in two types of quadrupole type mass spectroscopies (QMS (1) (manufactured by ULVAC, Inc.) and QMS (2) (manufactured by ANELVA Corporation), the QMS (1) was used to create "F2+ ion current value data" based on m/e: 40 Ar+ ion current value (an ion current value obtained in a flow of 1SLM) of an Ar gas. An $F_2$ gas was caused to flow to the QMS (2), and the calibration reference value of the ion current value of the Ar gas used in the QMS (1) was compared with an Ar ion current value obtained when the Ar gas was caused to flow in an amount of 1SLM to the QMS (2) so that the "F2+ ion current value" acquired in the QMS (2) was calibrated. Thus, this method was evaluated.

Consequently, FIG. 9 shows the result of the comparison of the (F2+ ion current values) in the QMS (1) and the QMS (2) by setting the Ar gas of the QMS (1) to be a calibration reference. As shown in FIG. 9, it was found that a flow and an ion current value are greatly coincident with each other if a comparison with one of the calibration references of the Ar gas is carried out to make investigations also in the different QMS devices. From this result, it was found that the $F_2$ calibration curve created in the QMS (1) might be used in any of the QMS devices if m/e=40 Ar+ion current value (Ar: 1SLM) is set to be the calibration reference.

By using such an $F_2$ calibration curve, accordingly, it is possible to efficiently detect an end point.

By using the quadrupole type mass spectroscopy (QMS) as the mass spectroscopy 70 to utilize an intensity relative value for Ar as the F intensity, thus, the amount of the F radical excited to contribute to the cleaning and returned to an original state again in the reaction chamber is set to be constant. Consequently, the cleaning in the reaction chamber can be ended accurately at a time that the cleaning is to be completed.

Moreover, it is preferable that an ion adhesion type mass spectroscopy (IAMS) should be used as the mass spectroscopy 70 and F—Li or $F_2$—Li should be used as an F intensity thereof.

Figure 10:
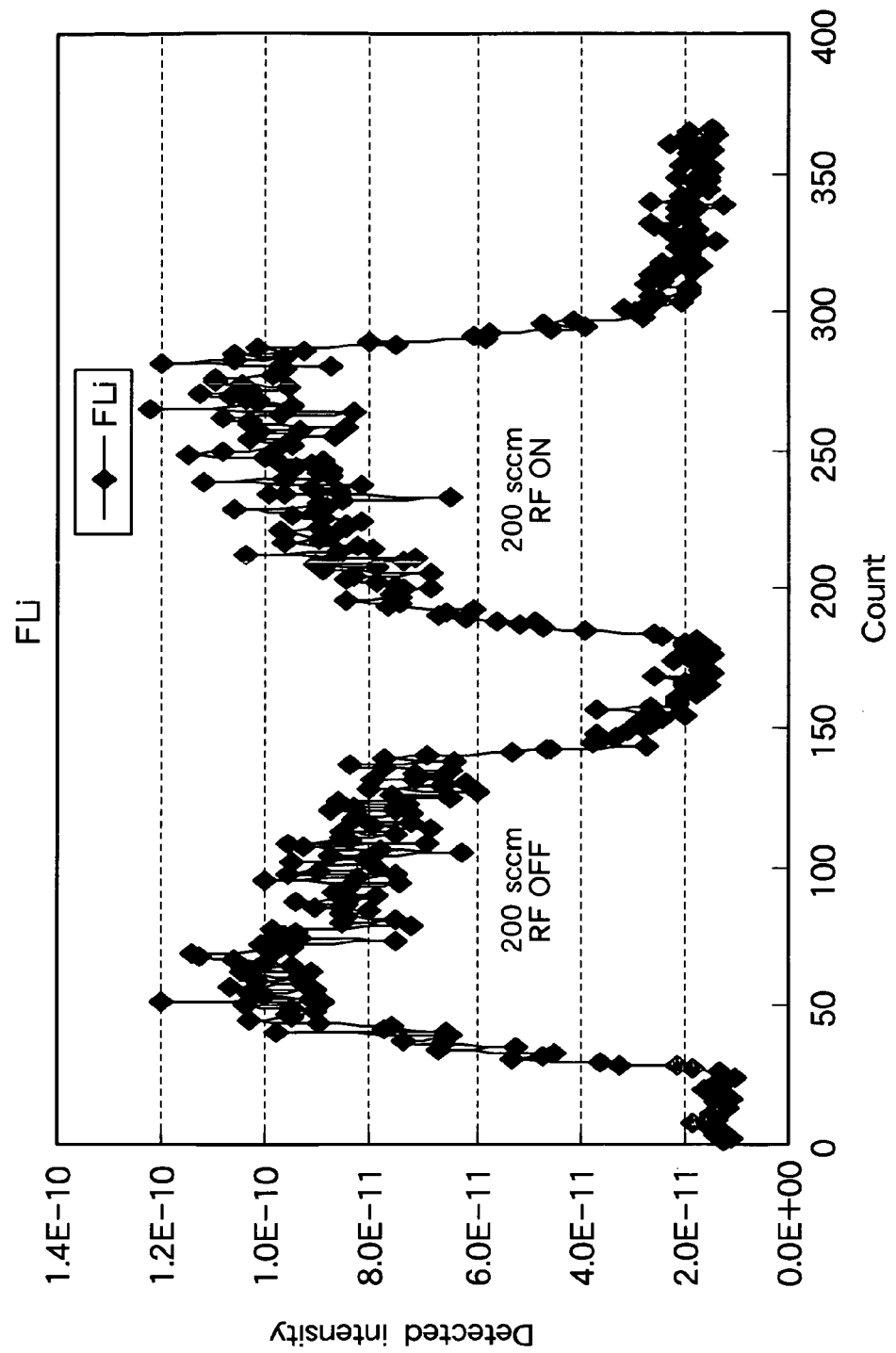
FIG. 10 is a graph showing the relationship of an F intensity in the case in which F—Li is used in an ion adhesion type mass spectroscopy (IAMS).
Figure 11:
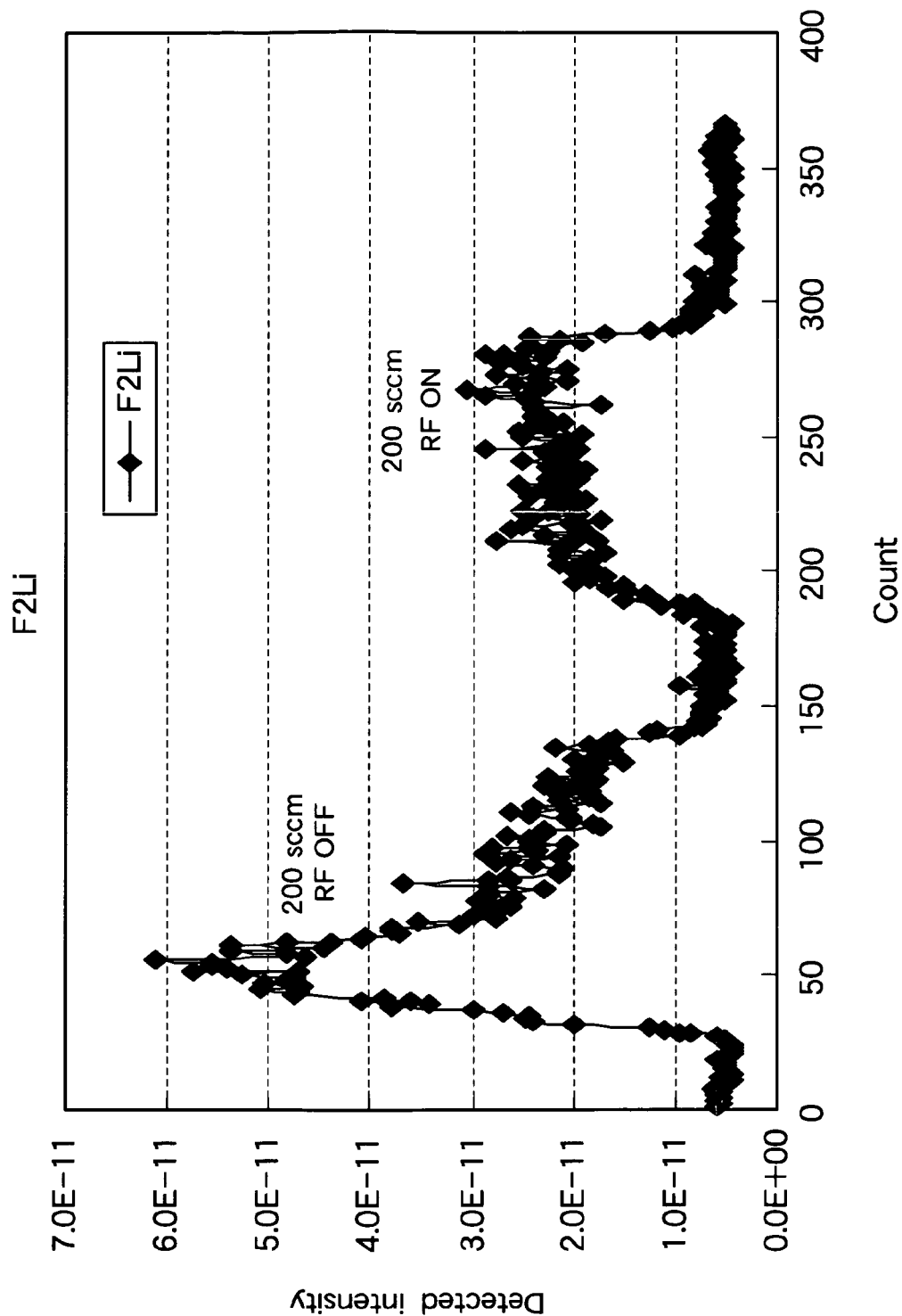
FIG. 11 is a graph showing the relationship of the F intensity in the case in which $F_2$—Li is used in the ion adhesion type mass spectroscopy (IAMS)

More specifically, based on graphs shown in FIGS. 10 and 11, it is possible to efficiently detect an end point by monitoring the F intensity detected after the ON/OFF operation of RF.

If the mass spectroscopy is the ion adhesion type mass spectroscopy (IAMS) and the F—Li or the $F_2$—Li is used as the F intensity, thus, the amount of the F radical excited to contribute to the cleaning and returned to an original state again in the reaction chamber is set to be constant. Thus, the cleaning in the reaction chamber can be ended accurately at the time that the cleaning is to be completed.

While the description has been given to the case in which the mass spectroscopy 70 is singly used in the above example, it is also possible to use the mass spectroscopy 70 in combination with an optical emission spectroscopy (OES) 40 and a Fourier transform infrared spectrometry (FTIR) 50, which is not shown.

Figure 12:
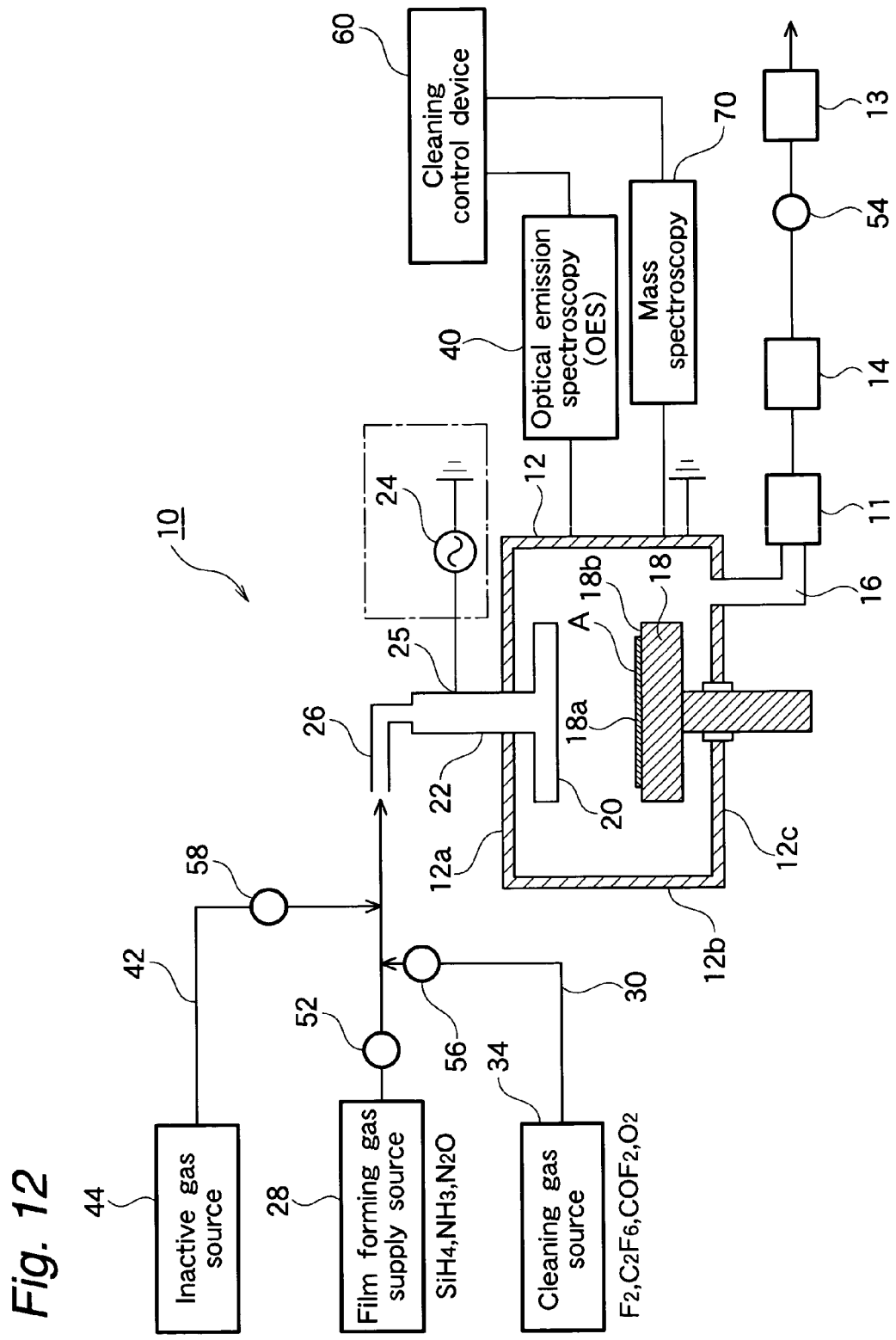
FIG. 12 is a schematic view showing a further example in which the apparatus for cleaning a CVD apparatus according to the present invention is applied to the CVD apparatus.

More specifically, for example, it is also possible to provide the optical emission spectroscopy (OES) 40 and the mass spectroscopy 70 in parallel with each other, thereby monitoring the luminous intensity data of the F radical in the reaction chamber, the F intensity data or both of the data by means of the optical emission spectroscopy 40, the mass spectroscopy 70 or both of them as shown in FIG. 12.

Figure 13:
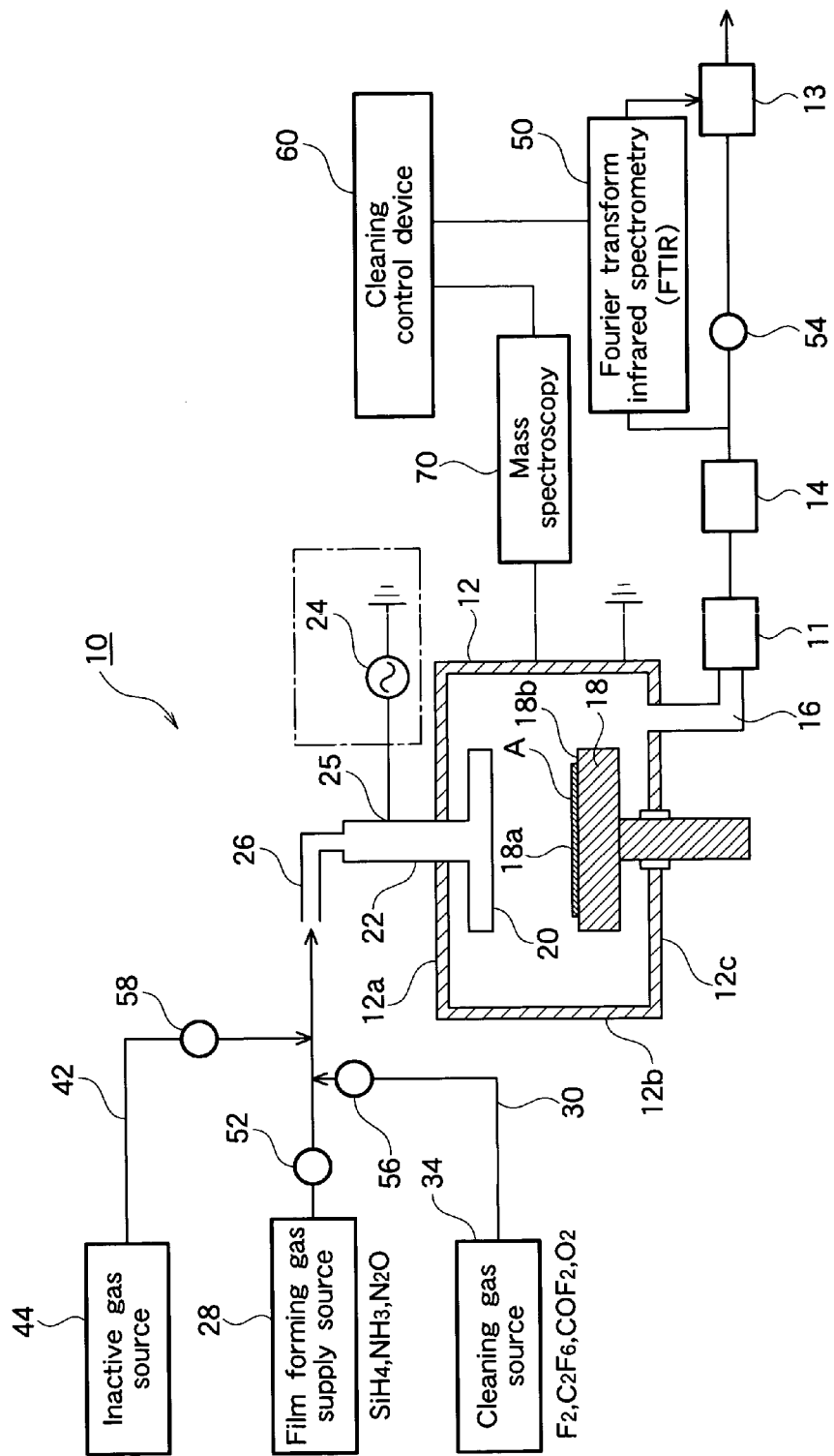
FIG. 13 is a schematic view showing a further example in which the apparatus for cleaning a CVD apparatus according to the present invention is applied to the CVD apparatus.
Figure 14:
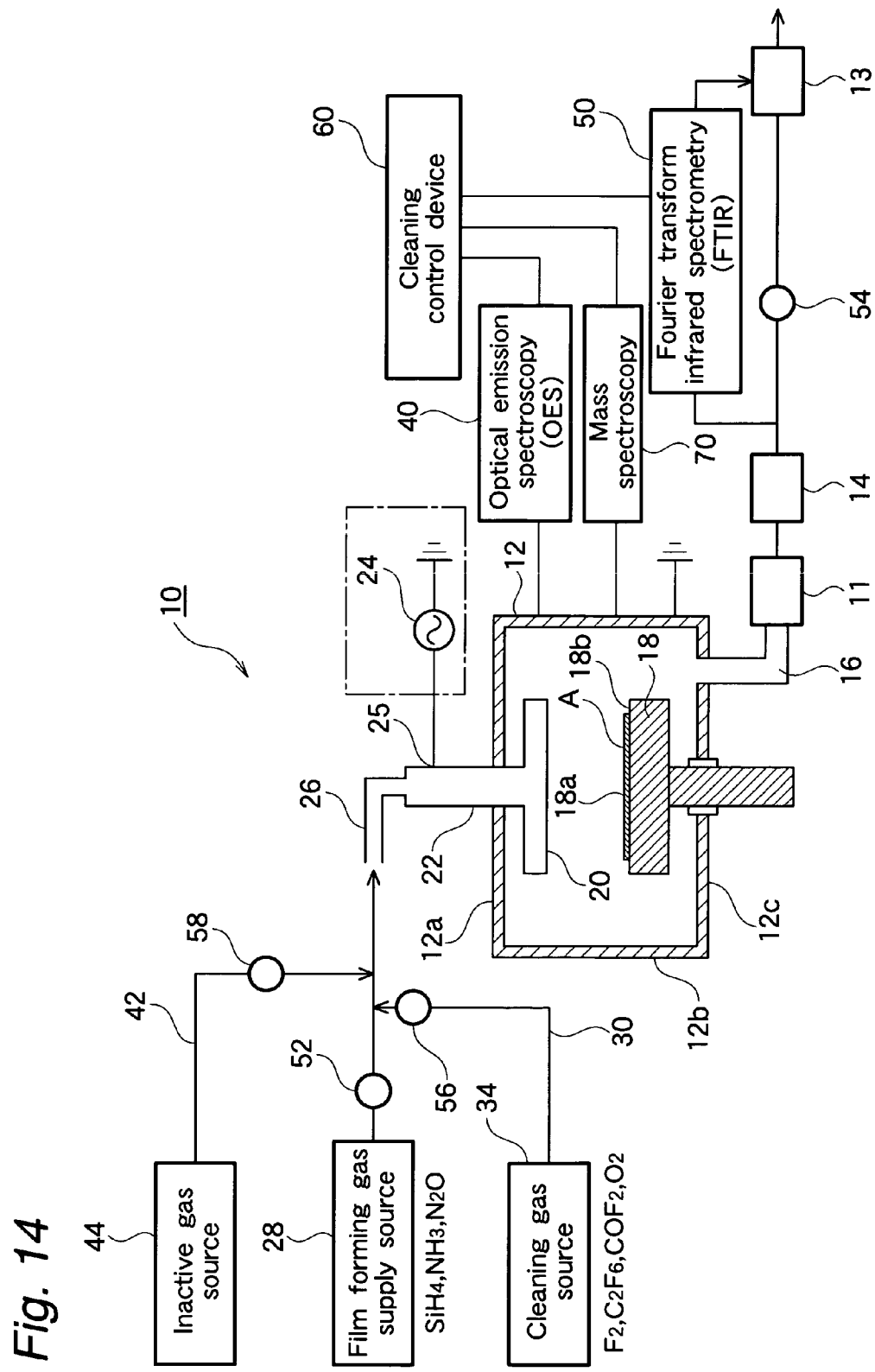
FIG. 14 is a schematic view showing a further example in which the apparatus for cleaning a CVD apparatus according to the present invention is applied to the CVD apparatus.
Figure 15:
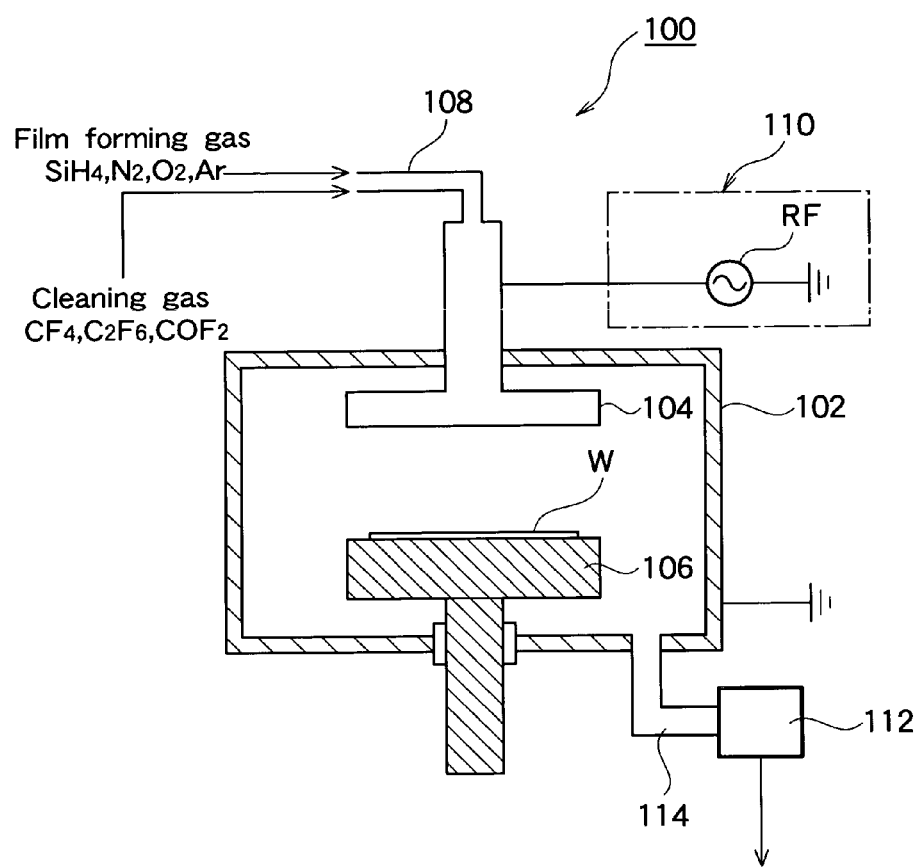
FIG. 15 is a schematic view showing a plasma CVD apparatus to be used in a conventional plasma CVD method.

For example, moreover, it is also possible to use the Fourier transform infrared spectrometry (FTIR) 50 and the mass spectroscopy 70 in combination as shown in FIG. 13, and furthermore, to use the optical emission spectroscopy (OES) 40 and the Fourier transform infrared spectrometry (FTIR) 50 in combination as shown in FIG. 14.

The examples of the apparatus for cleaning the plasma CVD apparatus according to the present invention have been described above. While the formation of the thin silicon film has been described for the above embodiments without departing from the scope of the present invention, for example, the present invention can also be applied to the case in which a thin film such as a silicon germanium film (SiGe), a silicon carbide film (SiC), an SiOF film, an SiON film or a carbon containing $SiO_2$ film is to be further formed.

While the apparatus of a horizontal type has been described in the examples, moreover, the apparatus can also be replaced with an apparatus of a vertical type. Although the examples have been described for a leaf type, furthermore, the present invention can also be applied to a CVD apparatus of a batch type.

While the present invention has been applied to a plasma CVD apparatus as an example in the above embodiments, furthermore, the present invention can also be applied to other CVD method such as vacuum deposition in which a thin film material is subjected to a thermal decomposition, an oxidation, a reduction, a polymerization, a vapor phase reaction or the like at a high temperature so that a thin film is deposited on a substrate. Thus, it is a matter of course that various changes can be made.

While the preferred examples according to the present invention have been described above, the present invention is not restricted thereto but various changes can be made without departing from the scope of the present invention.

(Effect of the Invention)

According to the present invention, after a predetermined time passes since the luminous intensity saturation point of an F radical in a reaction chamber or an F intensity saturation point is reached by an optical emission spectral analysis to be carried out by an optical emission spectroscopy (OES), the measurement of an F intensity to be carried out by a mass spectroscopy or both of them, cleaning is ended.

Accordingly, the amount of the F radical excited to contribute to the cleaning and returned to an original state again in the reaction chamber is set to be constant. Consequently, it is possible to accurately end the cleaning in the reaction chamber at the time that the cleaning is to be completed.

In addition, the cleaning is ended after a predetermined time passes since the luminous intensity saturation point or the F intensity saturation point is reached. Therefore, it is possible to carry out the cleaning over a by-product such as $SiO_2$ or $Si_3N_4$ stuck and deposited onto the piping of a gas discharging path or the like, thereby ending the cleaning accurately at the time that the cleaning is to be completed.

Accordingly, it is possible to prevent the time required for the cleaning from being excessively shortened and to perfectly remove the by-product such as $SiO_2$ or $Si_3N_4$ stuck and deposited onto the surface of an internal wall, an electrode or the like in the reaction chamber, the piping of the gas discharging path or the like without remaining.

Even if the CVD apparatus is used repetitively, consequently, particulates can be prevented from being mixed into a semiconductor product so that a contamination is not caused. Thus, a thin film of high quality can be manufactured, the disconnection or short circuit of a semiconductor circuit can be prevented from being caused and a yield or the like can be prevented from being deteriorated.

Moreover, the time required for the cleaning can be prevented from being excessively prolonged and a cleaning gas introduced into the reaction chamber can be prevented from being exactly discharged without contributing to the cleaning.

Accordingly, the cleaning gas constituted by a fluorine containing compound such as $CF_4$ or $C_2F_6$ can be prevented from being discharged into the air and there is no possibility that an adverse influence on an environment such as global warming might be generated.

Furthermore, the luminous intensity of the F radical obtained by the optical emission spectroscopy (OES) and the F intensity obtained by the mass spectroscopy are proportional to the etching rate (cleaning rate) of the by-product. Therefore, the cleaning is maintained for a predetermined time in a state in which a cleaning efficiency is high. Consequently, the cleaning efficiency can be enhanced.

According to the present invention, moreover, when the concentration data of $SiF_4$ in the gas discharged from the reaction chamber are monitored by a Fourier transform infrared spectrometry provided on a gas discharging path, and the cleaning is ended when a predetermined cleaning end point concentration is reached.

Accordingly, the concentration of the gasified $SiF_4$ generated by a reaction to the by-product such as $SiO_2$ or $Si_3N_4$ stuck and deposited onto the surface of the internal wall, the electrode or the like in the reaction chamber, the piping of the gas discharging path or the like during the cleaning is monitored directly. Therefore, the cleaning can be ended accurately at the time that the cleaning is to be completed.

Therefore, it is possible to prevent the time required for the cleaning from being excessively shortened and to perfectly remove the by-product such as $SiO_2$ or $Si_3N_4$ stuck and deposited onto the surface of the internal wall, the electrode or the like in the reaction chamber, the piping of the gas discharging path or the like without remaining.

Even if the CVD apparatus is used repetitively, consequently, particulates can be prevented from being mixed into a semiconductor product so that a contamination is not caused. Thus, a thin film of high quality can be manufactured, the disconnection or short circuit of a semiconductor circuit can be prevented from being caused and a yield or the like can be prevented from being deteriorated.

Moreover, the time required for the cleaning can be prevented from being excessively prolonged and a cleaning gas introduced into the reaction chamber can be prevented from being exactly discharged without contributing to the cleaning.

Accordingly, the cleaning gas constituted by a fluorine containing compound such as $CF_4$ or $C_2F_6$ can be prevented from being discharged into the air and there is no possibility that an adverse influence on an environment such as global warming might be generated.

According to the present invention, moreover, the luminous intensity data of the F radical in the reaction chamber are monitored by means of the optical emission spectroscopy, the F intensity data in the reaction chamber are monitored by the mass spectroscopy, or both of the data are monitored, and are compared with the prestored luminous intensity data, F intensity data or both of the data. When the luminous intensity saturation point or the F intensity saturation point is reached, the concentration data of $SiF_4$ in the gas discharged from the reaction chamber are monitored by the Fourier transform infrared spectrometry. When a predetermined cleaning end point concentration is reached, consequently, it is decided that the predetermined time has passed and the cleaning is thus ended.

Accordingly, the amount of the F radical excited to contribute to the cleaning and returned to an original state again in the reaction chamber is set to be constant. Consequently, it is possible to accurately end the cleaning in the reaction chamber at the time that the cleaning is to be completed.

In addition, the cleaning is ended after the predetermined time passes since the luminous emission saturation point or the F intensity saturation point is reached. Therefore, it is possible to carry out the cleaning over the by-product such as $SiO_2$ or $Si_3N_4$ stuck and deposited onto the piping of the gas discharging path or the like, thereby ending the cleaning accurately at the time that the cleaning is to be completed.

Referring to the predetermined time, furthermore, the concentration of the gasified $SiF_4$ generated by a reaction to the by-product is directly monitored. When the predetermined cleaning end point concentration is reached, the cleaning is ended. Consequently, the cleaning can be ended more accurately at the time that the cleaning is to be completed.

Accordingly, it is possible to prevent the time required for the cleaning from being excessively shortened and to perfectly remove the by-product such as $SiO_2$ or $Si_3N_4$ stuck and deposited onto the surface of the internal wall, the electrode or the like in the reaction chamber, the piping of the gas discharging path or the like without remaining.

Even if the CVD apparatus is used repetitively, consequently, particulates can be prevented from being mixed into a semiconductor product so that a contamination is not caused. Thus, a thin film of high quality can be manufactured, the disconnection or short circuit of a semiconductor circuit can be prevented from being caused and a yield or the like can be prevented from being deteriorated.

Moreover, the time required for the cleaning can be prevented from being excessively prolonged and the cleaning gas introduced into the reaction chamber can be prevented from being exactly discharged without contributing to the cleaning.

Accordingly, the cleaning gas constituted by a fluorine containing compound such as $CF_4$ or $C_2F_6$ can be prevented from being discharged into the air and there is no possibility that an adverse influence on an environment such as global warming might be generated.

Furthermore, the luminous intensity of the F radical obtained by the optical emission spectroscopy (OES) and the F intensity obtained by the mass spectroscopy are proportional to the etching rate (cleaning rate) of the by-product. Therefore, the cleaning is maintained for a predetermined time in a state in which a cleaning efficiency is high. Consequently, the cleaning efficiency can be enhanced.

According to the present invention, if the cleaning end point concentration is 100 ppm, moreover, the concentration of $SiF_4$ in the gas discharged from the reaction chamber corresponds to such a concentration as to perfectly remove the by-product such as $SiO_2$ or $Si_3N_4$ stuck and deposited onto the piping of the gas discharging path or the like in addition to the surface of the internal wall, the electrode or the like in the reaction chamber.

Therefore, the cleaning is ended in a cleaning end point concentration of 100 ppm. Consequently, it is possible to end the cleaning accurately at the time that the cleaning is to be completed. As a result, the by-product can be removed perfectly.

According to the present invention, moreover, the Fourier transform infrared spectrometry (FTIR) is provided at the downstream side of the dry pump on the gas discharging path. Therefore, the concentration data of $SiF_4$ in the gas discharged from the piping of the gas discharging path or the like in addition to the reaction chamber are monitored. Therefore, it is possible to perfectly remove the by-product such as $SiO_2$ or $Si_3N_4$ stuck and deposited onto the piping of the gas discharging path or the like in addition to the surface of the internal wall, the electrode or the like in the reaction chamber.

According to the present invention, furthermore, by using the quadrupole type mass spectroscopy (QMS) as a mass spectroscopy to utilize the intensity relative value for Ar as the F intensity, the amount of the F radical excited to contribute to the cleaning and returned to an original state again in the reaction chamber is set to be constant. Thus, the cleaning in the reaction chamber can be ended accurately at the time that the cleaning is to be completed.

According to the present invention, moreover, if the mass spectroscopy is an ion adhesion type mass spectroscopy (IAMS) and F—Li or $F_2$—Li is used as an F intensity thereof, thus, the amount of the F radical excited to contribute to the cleaning and returned to an original state again in the reaction chamber is set to be constant. Thus, the cleaning in the reaction chamber can be ended accurately at the time that the cleaning is to be completed. Thus, the present invention can produce many remarkable and peculiar functions and advantages, which is very excellent.

The invention claimed is:

1. A method for cleaning a CVD apparatus comprising:
a reactive gas introducing device for applying a high frequency to a reactive gas supplied into a reaction chamber through a reactive gas supply path and changing the reactive gas into a plasma, and supplying the reactive gas thus changed into the plasma into the reaction chamber; and
a counter electrode stage provided in the reaction chamber and serving to mount a base material for forming a deposited film,
the deposited film being formed on a surface of the base material over the counter electrode stage with the reactive gas changed into the plasma introduced into the reaction chamber through the reactive gas introducing device, the method comprising:
introducing a cleaning gas into the reaction chamber;
forming a high frequency plasma by generating a high frequency electric field from the high frequency applying device provided in the reaction chamber;
detoxifying a by-product gasified by the cleaning gas and deposited in the reaction chamber and discharging the detoxified by-product to the outside of the reaction chamber by a harm removing device;
carrying out an optical emission spectral analysis of an F radical in the reaction chamber using at least an optical emission spectroscopy (OES) provided in the reaction chamber to measure a luminous intensity;
monitoring $FLi^+$ or $F_2Li^+$ as an F intensity in the reaction chamber using an ion attachment type mass spectroscopy (IAMS);
monitoring the concentration of $SiF_4$ in the gas discharged from the reaction chamber by a Fourier transform infrared spectrometry (FTIR) provided on a gas discharging path for discharging the gas from the reaction chamber;
comparing monitored luminous intensity data, monitored F intensity data, and monitored concentration data of $SiF_4$, with pre-stored luminous intensity data, pre-stored F intensity data, and pre-stored concentration data of $SiF_4$, respectively;
stopping introducing the cleaning gas to end the cleaning at the earliest of
a passage of a predetermined time from the time when the monitored luminous intensity reaches a luminous intensity saturation point,
a passage of a predetermined time from the time when the monitored F intensity reaches an F intensity saturation point, and
a time when the monitored concentration data of $SiF_4$ reaches a predetermined cleaning endpoint concentration, wherein
the predetermined time is an arbitrary time between 15 seconds and 50 seconds, and
the predetermined cleaning endpoint concentration is 100 ppm.

* * * * *